(12) United States Patent
Akiyama

(10) Patent No.: US 10,044,289 B2
(45) Date of Patent: Aug. 7, 2018

(54) LED DRIVE CIRCUIT INCLUDING A PLURALITY OF LEDS CONNECTED IN SERIES

(71) Applicants: CITIZEN WATCH CO., LTD., Nishitokyo-shi, Tokyo (JP); CITIZEN ELECTRONICS CO., LTD., Yamanashi, Tokyo (JP)

(72) Inventor: Takashi Akiyama, Sayama (JP)

(73) Assignees: CITIZEN WATCH CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 0 days.

(21) Appl. No.: 15/564,669

(22) PCT Filed: Apr. 8, 2016

(86) PCT No.: PCT/JP2016/061603
§ 371 (c)(1),
(2) Date: Oct. 5, 2017

(87) PCT Pub. No.: WO2016/163533
PCT Pub. Date: Oct. 13, 2016

(65) Prior Publication Data
US 2018/0069483 A1    Mar. 8, 2018

(30) Foreign Application Priority Data
Apr. 8, 2015 (JP) .................. 2015-079020

(51) Int. Cl.
*H02M 7/06* (2006.01)
*H05B 37/02* (2006.01)
(Continued)

(52) U.S. Cl.
CPC .............. *H02M 7/06* (2013.01); *H01L 33/00* (2013.01); *H05B 37/029* (2013.01); *H02M 2001/0003* (2013.01)

(58) Field of Classification Search
CPC .. H02M 3/07; H02M 7/06; H02M 2001/0003; H01L 33/00; H05B 37/029
See application file for complete search history.

(56) References Cited

U.S. PATENT DOCUMENTS 9,673,310 B2 * 6/2017 Schie .................. H01L 29/7455
9,713,213 B2 * 7/2017 Jung .................... H05B 33/083
(Continued)

FOREIGN PATENT DOCUMENTS

JP    2012084580 A    4/2012
JP    2012244137 A    12/2012
(Continued)

OTHER PUBLICATIONS

International Preliminary Report on Patentability and Written Opinion for International Application No. PCT/JP2016/061603, dated Oct. 10, 2017, including English language translation, 8 pages.
(Continued)

*Primary Examiner* — Yusef A Ahmed
(74) *Attorney, Agent, or Firm* — RatnerPrestia

(57) ABSTRACT

The LED drive circuit has a rectifying circuit that rectifies an alternating-current voltage, an LED string including a plurality of LEDs connected in series, a first switch whose one end is connected to a cathode of an LED in a last stage of the LED string, a capacitor whose one end is connected to the other end of the first switch, a second switch that is connected between one end of the capacitor and the anode of the LED in the first stage of the LED string, and a third switch that is connected between the cathode of the LED in the last stage of the LED string and a second terminal of the
(Continued)

rectifying circuit, and which turns on when the full-wave rectified voltage is lower than a charge start voltage and turns off when the full-wave rectified voltage is higher than or equal to the charge start voltage.

5 Claims, 9 Drawing Sheets

(51) Int. Cl.
*H01L 33/00* (2010.01)
*H02M 1/00* (2006.01)

(56) References Cited

U.S. PATENT DOCUMENTS

| | | | | |
|---|---|---|---|---|
| 9,854,631 | B2* | 12/2017 | Akiyama | H05B 33/083 |
| 9,913,331 | B2* | 3/2018 | Arulandu | H05B 33/0815 |
| 2011/0109241 | A1* | 5/2011 | Kitamura | H05B 33/0815 |
| | | | | 315/291 |
| 2012/0139448 | A1* | 6/2012 | Chiang | H05B 33/083 |
| | | | | 315/307 |
| 2012/0299495 | A1* | 11/2012 | Sakuragi | H05B 33/0812 |
| | | | | 315/201 |
| 2013/0049618 | A1* | 2/2013 | Radermacher | H02M 1/08 |
| | | | | 315/200 R |
| 2014/0049174 | A1 | 2/2014 | Radermacher et al. | |
| 2014/0306614 | A1* | 10/2014 | Pan | H05B 33/0824 |
| | | | | 315/193 |
| 2014/0361695 | A1* | 12/2014 | Akiyama | H05B 33/0812 |
| | | | | 315/185 R |
| 2014/0367710 | A1* | 12/2014 | Akiyama | H01L 25/167 |
| | | | | 257/88 |
| 2015/0002035 | A1* | 1/2015 | Schie | H01L 27/0817 |
| | | | | 315/200 R |
| 2015/0108909 | A1* | 4/2015 | Rupp | H05B 33/083 |
| | | | | 315/188 |
| 2015/0181659 | A1* | 6/2015 | Kang | H05B 33/0809 |
| | | | | 315/186 |
| 2015/0305098 | A1* | 10/2015 | Jung | H05B 33/0824 |
| | | | | 315/122 |
| 2015/0382420 | A1* | 12/2015 | Sakai | H05B 33/0803 |
| | | | | 315/193 |
| 2016/0037593 | A1* | 2/2016 | Ido | H05B 33/0809 |
| | | | | 315/187 |
| 2016/0050731 | A1* | 2/2016 | Jung | H05B 33/0809 |
| | | | | 315/201 |
| 2016/0113077 | A1* | 4/2016 | Akiyama | H05B 33/0815 |
| | | | | 315/201 |
| 2017/0086265 | A1* | 3/2017 | Akiyama | H05B 33/083 |
| 2017/0231040 | A1* | 8/2017 | Ido | H02M 7/06 |
| 2017/0231051 | A1* | 8/2017 | Jin | H05B 33/0845 |
| 2017/0280532 | A1* | 9/2017 | Akiyama | H05B 37/02 |
| 2017/0290111 | A1* | 10/2017 | Akiyama | H05B 37/02 |

FOREIGN PATENT DOCUMENTS

| | | |
|---|---|---|
| JP | 2013118267 A | 6/2013 |
| JP | 2014509792 A | 4/2014 |

OTHER PUBLICATIONS

International Search Report and Written Opinion for International Application No. PCT/JP2016/061603, dated Jul. 5, 2016—5 Pages, 2017.

* cited by examiner

PRIOR ART

LED DRIVE CIRCUIT INCLUDING A PLURALITY OF LEDS CONNECTED IN SERIES

CROSS REFERENCE TO RELATED APPLICATIONS

This is the U.S. National Phase application of PCT/JP2016/061603, filed Apr. 8, 2016, which claims priority to Japanese Patent Application No. 2015-079020, filed Apr. 8, 2015, the disclosures of each of these applications being incorporated herein by reference in their entireties for all purposes.

TECHNICAL FIELD OF THE INVENTION

The embodiments discussed herein are related to an LED drive circuit that drives an LED by a rectified voltage obtained by rectifying an alternating-current voltage, and in more detail, related to an LED drive circuit capable of turning on a plurality of LEDs included in an LED string when the rectified voltage is lower than a threshold voltage of the LED string connecting the plurality of LEDs in series.

BACKGROUND OF THE INVENTION

An LED light emission device is known, which causes LEDs included in an LED string to emit light by applying a full-wave rectified waveform voltage (hereinafter, called a full-wave rectified voltage) obtained by full-wave rectifying an alternating-current voltage input from a commercial alternating-current power source to the LED string including a plurality of LEDs connected in series. In the LED light emission device, during a period of time in which the full-wave rectified voltage that is applied to the LED string does not reach a threshold voltage at which the LEDs begin to emit light, no current flows through the LED string, and therefore the LEDs included in the LED string do not turn on. When the LED light emission device includes a turned-on period of time in which the LED is turned on and a turned-off period of time in which the LED is turned off, a troublesome phenomenon, such as a flicker and a motion break in which a moving object is seen intermittently, may occur.

An LED drive circuit is known, which eliminates the turned-off period of time or shortens the turned-off period of time by charging a capacitor during the turned-off period of time and causing the capacitor to discharge to turn on LEDs during the period of time in which the full-wave rectified voltage does not reach the light emission threshold voltage of the LED string (for example, see Patent Literature 1).

FIG. 10A is a circuit diagram of an example of a conventional LED drive circuit and FIG. 10B is a circuit diagram of another example of a conventional LED drive circuit.

An LED drive circuit 901 includes a rectifying unit 910, an LED array 912, a first switch 913, a second switch 914, and a switch control unit 915. An LED drive circuit 902 includes a light output compensation unit 911, in addition to the rectifying unit 910, the LED array 912, the first switch 913, the second switch 914, and the switch control unit 915. The light output compensation unit 911 includes capacitors C1 and C2 and diodes D1, D2, and D3, forming a valley-fill circuit. The LED array 912 includes a first LED group 921 and a second LED group 922.

The LED drive circuit 901 supplies a full-wave rectified voltage supplied from the rectifying unit 910 to the LED array 912 and turns on LEDs included in the LED array 912. During a period of time in which the full-wave rectified voltage increases from 0 [V] and reaches a first threshold voltage at which the first LED group 921 begins to emit light, no current flows through the LED array 912, and therefore the LEDs included in the LED array 912 do not turn on. The first threshold voltage is the product of a forward drop voltage of the LEDs connected in series, which are included in the first LED group 921, and the number of serial stages of the LEDs included in the first LED group 921. During a period of time in which the full-wave rectified voltage is higher than or equal to the first threshold voltage and lower than a total threshold voltage, which is the total threshold voltage of the first threshold voltage and a second threshold value at which the second LED group 922 begins to emit light, the first switch 913 turns on and the LEDs included in the first LED group 921 turn on. The second threshold voltage is the product of a forward drop voltage of the LEDs connected in series, which are included in the second LED group 922, and the number of serial stages of the LEDs included in the second LED group 922. When the full-wave rectified voltage is higher than or equal to the total threshold voltage, by the first switch 913 turning off and the second switch 914 turning on, the LEDs included in both the first LED group 921 and the second LED group 922 turn on and all the LEDs included in the LED array 912 turn on. When the full-wave rectified voltage falls, the process is opposite to that when the full-wave rectified voltage increases.

In the LED drive circuit 901, the period of time in which the full-wave rectified voltage is lower than the first threshold voltage is the turned-off period of time in which the LEDs included in the LED array 912 do not turn on.

On the other hand, the LED drive circuit 902 including the light output compensation unit 911 does not have the turned-off period of time. When the full-wave rectified voltage is lower than the first threshold voltage of the first LED group 921, a voltage higher than or equal to the first threshold voltage is applied to the first LED group 921 from the capacitors C1 and C2 and the LEDs included in the first LED group 921 are kept turned on.

The light output compensation unit 911 is explained. The diodes D1, D2, and D3 included in the light output compensation unit 911 turn on when the anode voltage is higher than the cathode voltage and a forward bias is applied, and turn off when the anode voltage is lower than the cathode voltage and a reverse bias is applied. It is assumed that the forward drop voltage of the diodes D1, D2, and D3 is 0 [V] as a matter of convenience and the capacitance of the capacitor C1 is the same as that of C2.

During the period of time in which the full-wave rectified voltage increases from 0 [V] and reaches a peak voltage Vp, the diode D1 turns on and the capacitors C1 and C2 are charged. During the period of time in which the full-wave rectified voltage falls from the peak voltage Vp [V] to a voltage of Vp/2 [V], which is half the peak voltage, the diodes D1, D2, and D3 turn off and the capacitors C1 and C2 enter a floating state. The charged voltage of the capacitors C1 and C2 when the capacitors C1 and C2 enter the floating state is Vp/2 [V]. During the period of time in which the full-wave rectified voltage falls from Vp/2 [V] to 0 [V] and during the period of time in which the full-wave rectified voltage increases from 0 [V] to Vp/2 (V), the diode D1 turns off, the diodes D2 and D3 turn on, and the capacitors C1 and C2 discharge, when the first threshold voltage at which the first LED group 921 begins to emit light is lower than Vp/2 [V], during the period of time in which the full-wave rectified voltage falls from Vp/2 [V] to 0 [V] and during the period of time in which the full-wave rectified voltage increases from 0 [V] to Vp/2 [V], a current is supplied to the first LED group 921 from the capacitors C1 and C2 and the first LED group 921 keeps light emission.

In the LED drive circuit 902, when the full-wave rectified voltage is lower than the first threshold voltage, a current is supplied to the first LED group 921 from the capacitors C1 and C2 included in the light output compensation unit 911 and the LEDs included in the first LED group 921 turn on, and therefore the turned-off period of time may be eliminated.

CITATION LIST

Patent Literature

Japanese Unexamined Patent Application Publication (Translation of PCT application) No. 2015-506105

SUMMARY

Technical Problem

However, in the LED drive circuit 902, the capacitors C1 and C2 are charged during the period of time in which the full-wave rectified voltage increases, but not charged during the period of time in which the full-wave rectified voltage falls. In the LED drive circuit 902, the alternating current supplied from the commercial alternating-current power source is different between the period of time in which the full-wave rectified voltage increases and the period of time in which full-wave rectified voltage falls, and therefore the waveform of the alternating current may distort from a sinusoidal wave. In the LED drive circuit 902, the waveform of the alternating current distorts from a sinusoidal wave, and therefore total harmonic distortion (THD) is not reduced.

An object of the present invention is to provide an LED drive circuit having no turned-off period of time and capable of reducing the total harmonic distortion by supplying a current to an LED string from a capacitor to cause LEDs to emit light when the full-wave rectified voltage is lower than a threshold voltage at which the LEDs included in the LED string begin to emit light.

Solution to Problem

The LED drive circuit of the present invention has a rectifying circuit that rectifies an alternating-current voltage and outputs a full-wave rectified voltage; an LED string including a plurality of LEDs connected in series, in which an anode of an LED in a first stage of the LEDs is connected with a first terminal of the rectifying circuit; a first switch whose one end is connected to a cathode of an LED in a last stage of the LED string; a capacitor whose one end is connected to the other end of the first switch; a second switch that is connected between one end of the capacitor and the anode of the LED in the first stage of the LED string; a third switch that is connected between the cathode of the LED in the last stage of the LED string and a second terminal of the rectifying circuit, and which turns on when the full-wave rectified voltage is lower than a charge start voltage and turns off when the full-wave rectified voltage is higher than or equal to the charge start voltage; and a current limiting circuit whose current input terminal is connected to the other end of a capacitor and whose current output terminal is connected to the second terminal of the rectifying circuit.

Further, in the LED drive circuit of the present invention, it is preferable for the first switch to include a diode whose anode is connected to the cathode of the LED in the last stage of the LED string and whose cathode is connected to one end of the capacitor, and for the second switch to include a diode whose anode is connected to one end of the capacitor and whose cathode is connected to the anode of the LED in the first stage of the LED string.

Further, in the LED drive circuit of the present invention, it is preferable for the current limiting circuit to have a first FET whose drain is connected to the other end of the capacitor and a first resistor whose one end is connected to the source of the first FET, for the third switch to include a third FET whose drain is connected to the cathode of the LED in the last stage of the LED string and a third resistor whose one end is connected to the source of the third FET, for the other end of the first resistor to be connected to one end of the third resistor, and for the other end of the third resistor to be connected to the second terminal of the rectifying circuit.

Further, it is preferable for the LED drive circuit of the present invention to further have a charge diode that is inserted between the other end of the first resistor and one end of the third resistor, whose anode is connected to the other end of the first resistor, and whose cathode is connected to one end of the third resistor, and a discharge diode whose anode is connected to the other end of the third resistor and whose cathode is connected to the other end of the capacitor.

Further, in the LED drive circuit of the present invention, it is preferable for the LED string to include a first partial LED string and a second partial LED string whose anode of the LED in the first stage is connected to the cathode of the LED in the last stage of the first partial LED string and to further have a fourth switch whose one end is connected to the cathode of the LED in the last stage of the first partial LED string and to the anode of the LED in the first stage of the second partial LED string and whose other end is connected to the second terminal of the rectifying circuit.

Further, in the LED drive circuit of the present invention, it is preferable for the LED string to include a third partial LED string whose anode of the LED in the first stage is connected with the first terminal of the rectifying circuit, a second switch, and a fourth partial LED string whose anode of the LED in the first stage is connected with the cathode of the LED in the last stage of the third partial LED string, and to further have a second capacitor connected in parallel to the third partial LED string.

Advantageous Effects of Invention

The period of time in which a current flows to the capacitor from the rectifying circuit is a period of time in which the charge start voltage, which is the sum of the threshold voltage and the end-to-end voltage of the capacitor, is exceeded. Further, in the LED drive circuit of the present invention, when the full-wave rectified voltage is lower than the threshold voltage at which the LEDs included in the LED string begin to emit light, only the capacitor supplies a current to the LED string and no current flows in from the commercial alternating-current power source. The period of time in which a current flow to the capacitor from the rectifying circuit includes both the period of time in which the full-wave rectified voltage increases and the period of time in which the full-wave rectified voltage falls and the current becomes constant, and at the same time, during the period of time in which the full-wave rectified voltage is lower than the threshold value, no current flows in from the commercial alternating-current power source, and therefore the waveform of the current that flows into the LED drive circuit from the commercial alternating-current power source is symmetrical with respect to the peak of the full-wave rectified voltage as an axis.

As above, in the LED drive circuit of the present invention, a current may flow through the LED string during all the periods of time of the full-wave rectified voltage and the waveform of the current that flows in from the outside is approximated to a sinusoidal wave, and therefore there is no turned-off period of time and the total harmonic distortion may be low.

DESCRIPTION OF EMBODIMENTS

In the following, with reference to the attached drawings 1 to 9, preferred embodiments of the present invention are explained in detail. In the explanation of the drawings, the same symbol is attached to the same or corresponding element and duplicated explanation is omitted.

Figure 1:
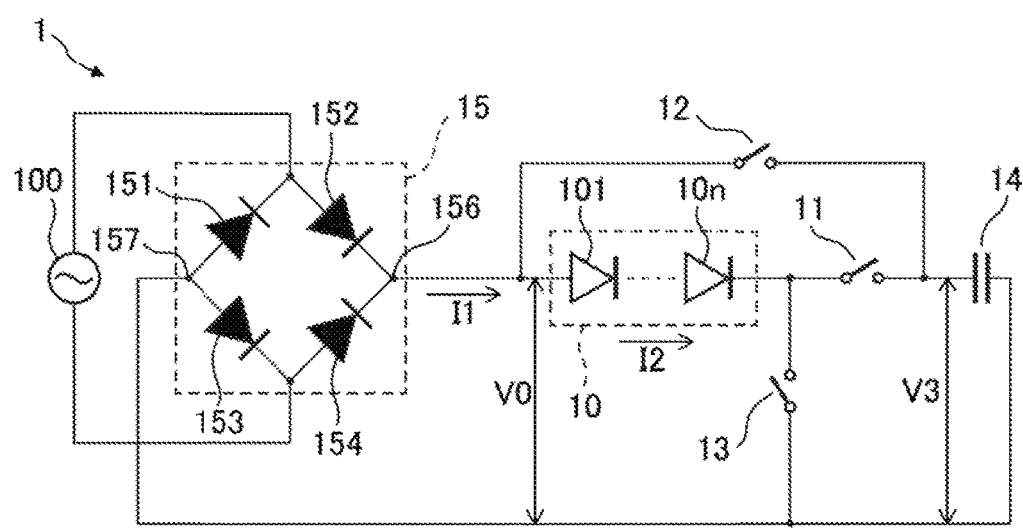
FIG. 1 is a circuit diagram of an LED drive circuit according to the present invention.

FIG. 1 is a circuit diagram of an LED drive circuit according to the present invention.

An LED drive circuit 1 has an LED string 10, a first switch 11 to a third switch 13, a capacitor 14, and a rectifying circuit 15 that rectifies an alternating-current voltage that is input from a commercial alternating-current power source 100 and outputs a full-wave rectified voltage V0 between a first terminal 156 and a second terminal 157. The LED string 10 includes LEDs 101 to 10n connected in series and when the voltage is higher than or equal to a threshold voltage V1, a light emission current I2 flows and the LEDs 101 to 10n emit light. The term "to connect" or "to be connected" includes not only a state where a first element and a second element are connected directly but also a state where the first element and the second element are connected via a third element (the term "to connect" or "to be connected" is similarly used in the following). Further, the full-wave rectified voltage V0 is a conceptual voltage represented as a reference or the like with respect to time about the operation of the LED drive circuit 1 and does not appear on any wire of the LED drive circuit 1.

The first switch 11 is connected between the cathode of the LED 10n in the last stage of the LED string 10 and one end of the capacitor 14 and turns off when the full-wave rectified voltage V0 is lower than a charge star-voltage V2 and turns on when the full-wave rectified voltage V0 is higher than or equal to the charge start voltage V2. The first switch 11 has a current limiting function to cause a second constant current I12 (see FIG. 2B) to flow while the first switch 11 is on. The charge start voltage V2 refers to the sure of the threshold voltage V1 and an end-to-end voltage V3 of the capacitor 14 (hereinafter, called a capacitor voltage V3) and in the LED drive circuit 1, the charge start voltage V2 has a value at least twice that of the threshold voltage V1. The second switch 12 is connected between one end of the capacitor 14 and the anode of the LED 101 in the first stage of the LED string 10, and turns on when the full-wave rectified voltage V0 is lower than the threshold voltage V1 and turns off when the full-wave rectified voltage V0 is higher than or equal to the threshold voltage V1. The third switch 13 is connected between the cathode of the LED 10n in the last stage of the LED string 10 and the second terminal 157 of the rectifying circuit 15, and turns on when the full-wave rectified voltage V0 is lower than the charge start voltage V2 and turns off when the full-wave rectified voltage V0 is higher than or equal to the charge start voltage V2. The third switch 13 has a current limiting function, while the third switch 13 is on, to cause a first constant current I11 (see FIG. 2B) to flow, which is smaller than the second constant current I12 that flows while the first switch 11 is on.

One end of the capacitor 14 is connected to the cathode of the LED 10n in the last stage of the LED string 10 via the first switch 11 and at the same time, is connected to the anode of the LED 101 in the first stage of the LED string 10 via the second switch 12. The other end of the capacitor 14 is connected to the second terminal 157 of the rectifying circuit 15. While the LED drive circuit 1 is in the normal operation, the capacitor voltage V3 is higher than the threshold voltage V1. The capacitor 14 is charged when the first switch 11 turns on and discharged when the second switch 12 turns on.

The rectifying circuit 15 has a first rectifying diode 151 to a fourth rectifying diode 154, the first terminal 157, and the second terminal 157. The anode of the first rectifying diode 151 is connected to the second terminal 157 and the cathode of the first rectifying diode 151 is connected to the anode of the second rectifying diode 152 and at the same time, to one end of the commercial alternating-current power source 100. The cathode of the second rectifying diode 152 is connected to the cathode of the fourth rectifying diode 154 and at the same time, to the first terminal 156. The anode of the third rectifying diode 153 is connected to the second terminal 157 and the cathode of the third rectifying diode 153 is connected to the anode of the fourth rectifying diode 154 and at the same time, to the other end of the commercial alternating-current power source 100. The first terminal 156 is connected to the anode of the LED 101 in the first stage of the LED string 10 and the second terminal 157 is connected to the cathode of the LED 10n in the last stage of the LED string 10 via the third switch 13. The rectifying circuit 15 rectifies an alternating-current voltage and outputs the full-wave rectified voltage V0 whose peak voltage Vp is higher than the charge start voltage V2 between the first terminal 156 and the second terminal 157. The rectifying circuit 15 outputs a rectified current I1 from the first terminal 156. The rectified current I1 changes in accordance with the full-wave rectified voltage V0.

Figure 2A:
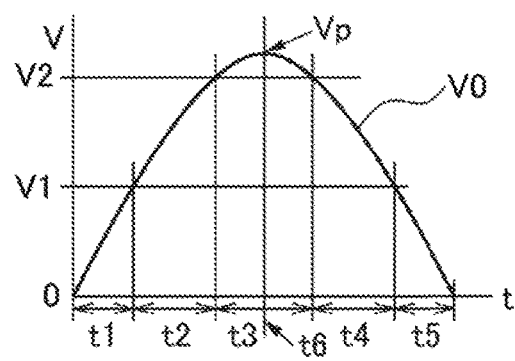
FIG. 2A is a diagram illustrating a change over time across one period of the full-wave rectified voltage.
Figure 2B:
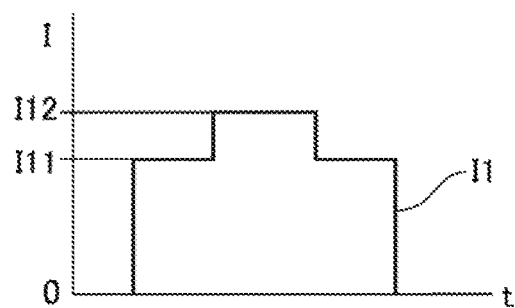
FIG. 2B is a diagram illustrating a change over time in the rectified current.
Figure 2C:
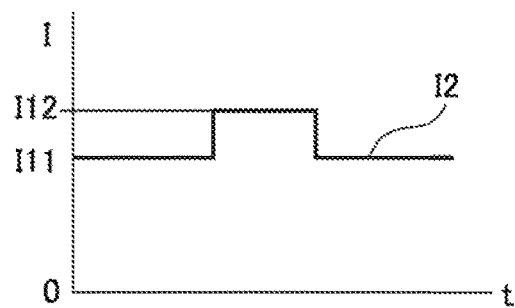
FIG. 2C is a diagram illustrating a change over time in the light emission current.
Figure 2D:
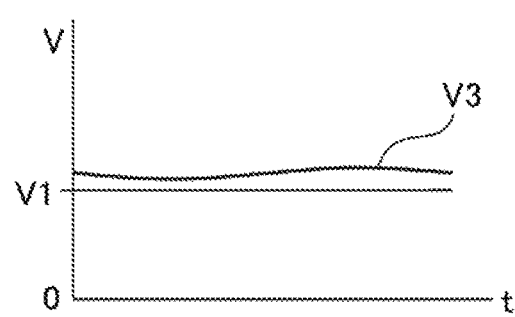
FIG. 2D is a diagram illustrating a change over time in the capacitor voltage.

FIG. 2A is a diagram illustrating a change over time across one period of the full-wave rectified voltage V0 that is output between the first terminal 156 and the second terminal 157 of the rectifying circuit 15. FIG. 2B is a diagram illustrating a change over time in the rectified current I1 in accordance with the change in the full-wave rectified voltage V0, FIG. 2C is a diagram illustrating a change over time in the light emission current I2 in accordance with the change in the full-wave rectified voltage V0, and FIG. 2D is a diagram illustrating a change over time in the capacitor voltage V3 in accordance with the change in the full-wave rectified voltage V0. In FIG. 2A to FIG. 2D, the horizontal axis represents the time, in FIG. 2A and FIG. 2D, the vertical axis represents the voltage, and in FIG. 2B and FIG. 2C, the vertical axis represents the current. The time of the horizontal axis in FIG. 2B to FIG. 2D has the same length of the time of the horizontal axis in FIG. 2A. The horizontal axis in FIG. 2A includes periods of time t1 to t5 and time t6. Period of time t1 is a period of time in which the full-wave rectified voltage V0 increases from 0 [V] to the threshold voltage V1, period of time t2 is a period of time in which the full-wave rectified voltage V0 increases from the threshold voltage V1 to the charge start voltage V2, and period of time t3 is a period of time in which the full-wave rectified voltage V0 is higher than or equal to the charge start voltage V2. Period of time t4 is a period of time in which full-wave rectified voltage V0 falls from the charge start voltage V2 to the threshold voltage V1, period of time t5 is a period of time in which the full-wave rectified voltage V0 falls from the threshold voltage V1 to 0 [V], and time t6 is a time at which the full-wave rectified voltage V0 reaches the peak voltage Vp. The charge start voltage V2 fluctuates due to charge/discharge the capacitor 14 but the fluctuations are small compared to the full-wave rectified voltage V0. Further, the capacitor voltage V3 is slightly higher than the threshold voltage V1. Thus, as a matter of convenience for explanation, in FIG. 2A, the charge start voltage V2 is handled as a constant value (2×V1) (the charge start voltage V2 is similarly handled in the following).

Figure 3A:
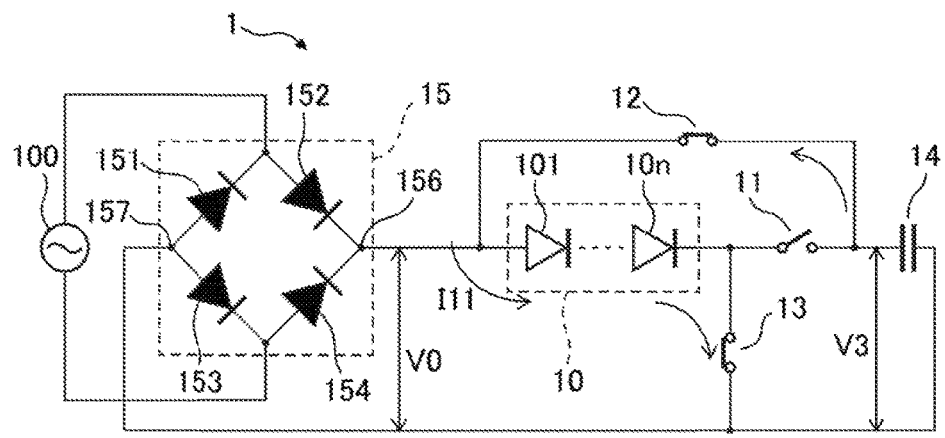
FIG. 3A is a diagram illustrating the operating state of the LED drive circuit 1 during period of time t1 and period of time t5 illustrated in FIG. 2A.
Figure 3B:
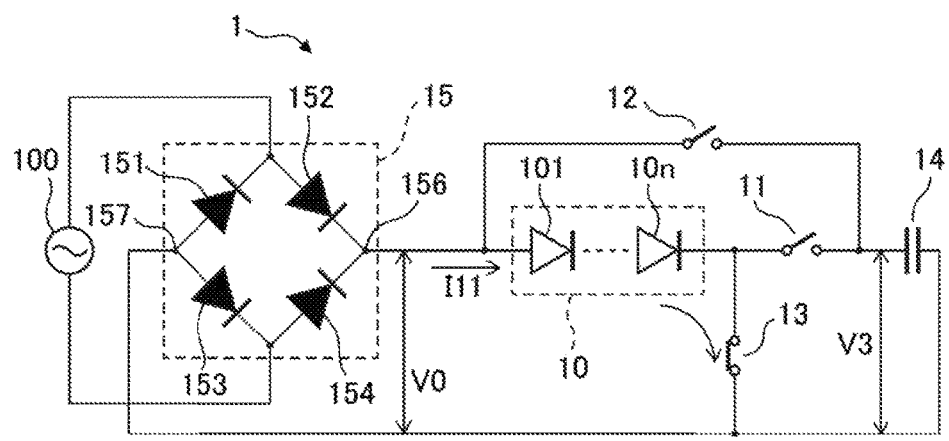
FIG. 3B is a diagram illustrating the operating state of the LED drive circuit 1 during period of time t2 and period of time t4 illustrated in FIG. 2A.
Figure 3C:
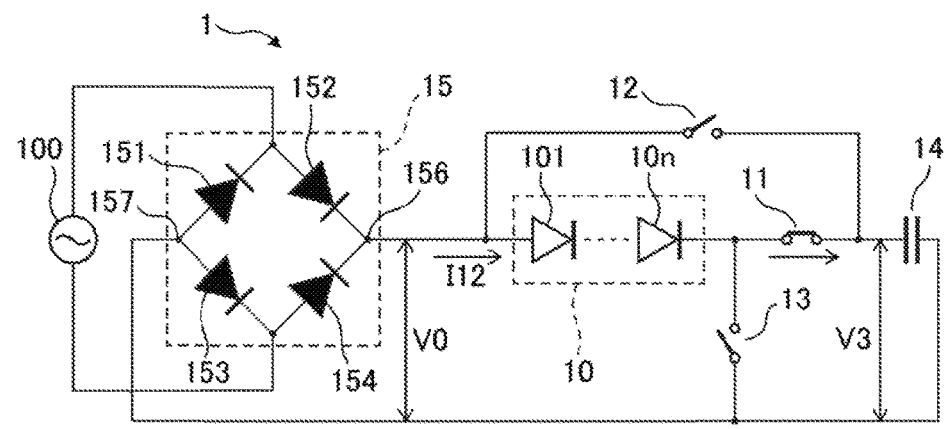
FIG. 3C is a diagram illustrating the operating state of the LED drive circuit 1 during period of time t3 illustrated in FIG. 2A.

FIG. 3A is a diagram illustrating the operating state of the LED drive circuit 1 during period of time t1 and period of time t5 illustrated in FIG. 2A, FIG. 3B is a diagram illustrating the operating state of the LED drive circuit 1 during period of time t2 and period of time t4 illustrated in FIG. 2A, and FIG. 3C is a diagram illustrating the operating state of the LED drive circuit 1 during period of time t3 illustrated in FIG. 2A.

During period of time t1 and period of time t5 illustrated in FIG. 2A, the first switch 11 turns off and the second switch 12 and the third switch 13 turn on. Since the second switch 12 turns on, one end of the capacitor 14 and the anode of the LED 101 in the first stage of the LED string 10 are connected. Further, the third switch 13 turns on, and therefore the other end of the capacitor 14 and the cathode of the LED 10n in the last stage of the LED string 10 are connected. One end of the capacitor 14 and the anode of the LED 101 in the first stage of the LED string 10 are connected and the other end of the capacitor 14 and the cathode of the LED 10n in the last stage of the LED string 10 are connected, and therefore the capacitor voltage V3 is applied across both ends of the LED string 10. The capacitor voltage V3 is higher than the threshold voltage V1 at which the LED string 10 begins to emit light, and therefore the first constant current I11 whose upper limit is limited by the third switch 13 flows through the LED string 10 and each of the LEDs 101 to 10n included in the LED string 10 emits light.

During period of time t2 and period of time t4 illustrated in FIG. 2A, the first switch 11 and the second switch 12 turn off and the third switch 13 turns on. The second terminal 157 of the rectifying circuit 15 and the cathode of the LED 10n in the last stage of the LED string 10 are connected by turning on the third switch 13. Thus, the full-wave rectified voltage V0 is applied across both ends of the LED string 10. During period of time t2 and period of time t4 illustrated in FIG. 2A, the full-wave rectified voltage V0 is higher than the threshold voltage V1 at which the LED string 10 begins to emit light, and therefore the first constant current I11 whose upper limit is limited by the third switch 13 flows through the LED string 10 and each of the LEDs 101 to 10n included in the LED string 10 emits light.

During period of time t3 illustrated in FIG. 2A, the first switch 11 turns on and the second switch 12 and the third switch 13 turn off. One end of the capacitor 14 and the cathode of the LED 10n in the last stage of the LED string 10 are connected by turning on the first switch 11. The other end of the capacitor 14 is connected to the second terminal 157 of the rectifying circuit 15, and therefore the cathode of the LED 10n in the last stage of the LED string 10 is connected to the second terminal 157 of the rectifying circuit 15 via the capacitor 14. The second terminal 157 of the rectifying circuit 15 and the cathode of the LED 10n in the last stage of the LED string 10 are connected via the capacitor 14 and the first switch 11, and therefore a voltage is applied across both ends of the LED string 10, which is obtained by subtracting the capacitor voltage V3 and a voltage drop due to the first switch 11 from the full-wave rectified voltage VC. As described previously, the charge start voltage V2 is the total voltage of the threshold voltage V1 and the capacitor voltage V3 that is higher than the threshold voltage V1, and the voltage crop due to the first switch 11 is automatically set, since the current value in the current path becomes constant. Further, during period of time t3, the full-wave rectified voltage V0 is higher than the charge start voltage V2. Thus, during period of time t3, the end-to-end voltage of the LED string 10 becomes higher than the threshold voltage V1 at which the LED string 10 begins to emit light. Thus, the second constant current I12 that flows via the first switch 11 flows through the LED string 10 and each of the LEDs 101 to 10n included in the LED string 10 emits light. Further, during period of time t3 illustrated in FIG. 2A, the capacitor 14 is charged by the second constant current I12 flowing to the capacitor 14 via the first switch 11. The first switch 11 limits the current, and therefore the charge of the capacitor 14 continues even after the peak (time t6) of the full-wave rectified voltage V0.

The LED drive circuit 1 causes the LEDs 101 to 10n to emit light by causing the first constant current I11 to flow through the LED string from the capacitor 14 via the second switch 12 when the full-wave rectified voltage V0 is lower than the threshold voltage V1 at which the LED 101 to 10n included in the LED string 10 begin to emit light. Further, the LED drive circuit 1 causes the LED 101 to 10n to emit light and charges the capacitor 14 by causing the second constant current I12 to flow through the LED string 10 and to the capacitor 14 when the full-wave rectified voltage V0 is higher than the charge start voltage V2, which is the total voltage of the threshold voltage V1 and the capacitor voltage V3.

During period of time t1 and period of time t5 illustrated in FIG. 2A, the rectified current I1 does not flow and a current is supplied from the capacitor 14, and thereby, the light emission current I2 flows. During period of time t2 and period of time t4 illustrated in FIG. 2A, the rectified current I1 flows as the light emission current I2 via the third switch 13. During period of time t2 and period of time t4 illustrated in FIG. 2A, the light emission current I2 flows via the third switch 13 having the current limiting function to limit the light emission current I2 to the first constant current I11, and therefore the light emission current I2 becomes equal to the first constant current I11. During period of time t3 illustrated in FIG. 2A, the rectified current I1 flows to the capacitor 14 as the light emission current I2 via the first switch 11 and the capacitor 14 is charged. During period of time t3 illustrated in FIG. 2A, the light emission current I2 flows via the first switch 11 having the current limiting function to limit the light emission current I2 to the second constant current I12, and therefore the light emission current I2 becomes equal to the second constant current I12.

First Embodiment

Figure 4:
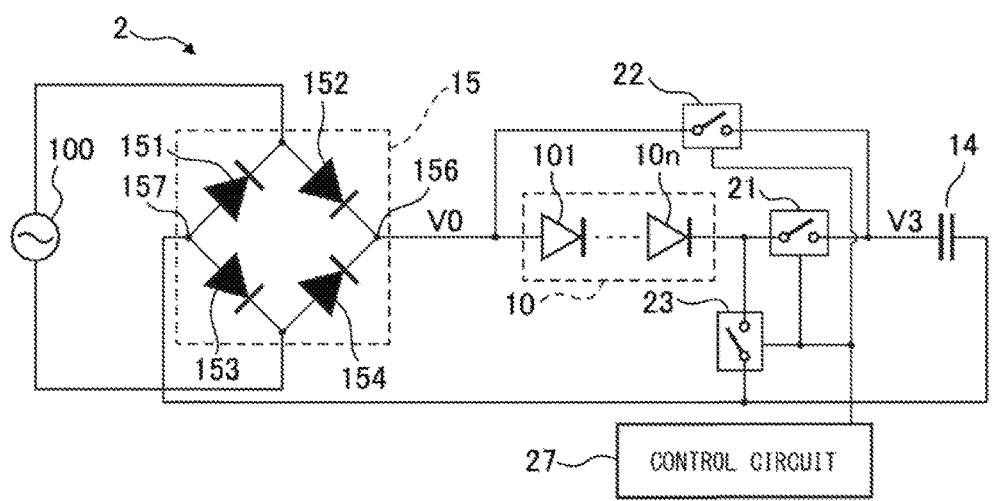
FIG. 4 is a circuit diagram of an LED drive circuit according to a first embodiment.

FIG. 4 is a circuit diagram of an LED drive circuit according to a first embodiment.

An LED drive circuit 2 differs from the LED drive circuit 1 in that a first switch 21 to a third switch 23 are arranged in place of the first switch 11 to the third switch 13. The LED drive circuit 2 further differs from the LED drive circuit 1 in having a control circuit 27 that controls the first to third switches based on an alternating-current signal, an output signal of the rectifying circuit 15, and a voltage of the capacitor 14. The components of the LED drive circuit 2 other than the first switch 21 to the third switch 23 and the control circuit 27 and the functions thereof are the same as the components of the LED drive circuit 1, to which the same symbols are attached, and the functions thereof. Detailed explanation of the components of the LED drive circuit 2 other than the first switch 21 to the third switch 23 and the control circuit 27 is omitted.

Each of the first switch 21 to the third switch 23 turns on an off in accordance with a control signal that is input from the control circuit 27. Each of the first switch 21 and the third switch 23 may have the current limiting function to limit a current that flows through each of the first switch 21 and the third switch 23.

The control circuit 27 acquires an alternating-current voltage and the full-wave rectified voltage V0 from the commercial alternating-current power source 100 and turns on and off the first switch 21 to the third switch 23 so that the LED drive circuit 2 performs the operation explained by referring to FIG. 2B to FIG. 2D during each of periods of time t1 to t5 illustrated in FIG. 2A.

Second Embodiment

Figure 5A:
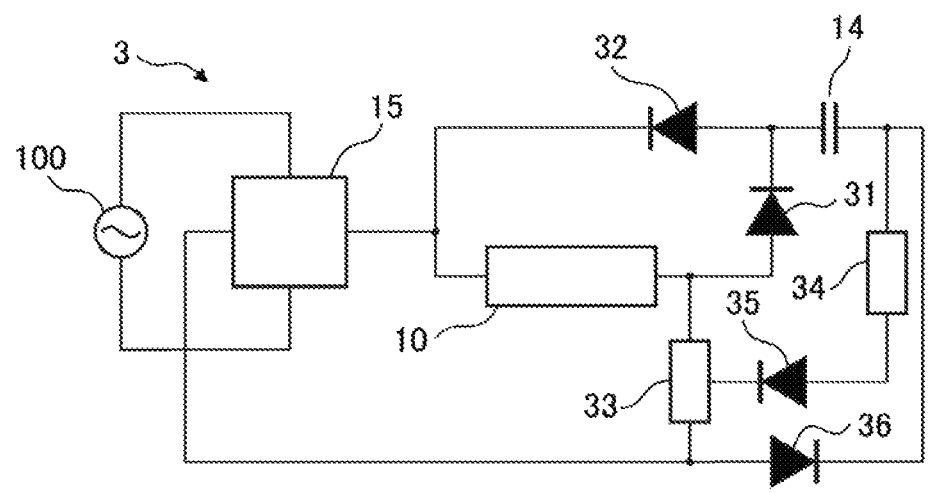
FIG. 5A is a block diagram of an LED drive circuit according to a second embodiment.
Figure 5B:
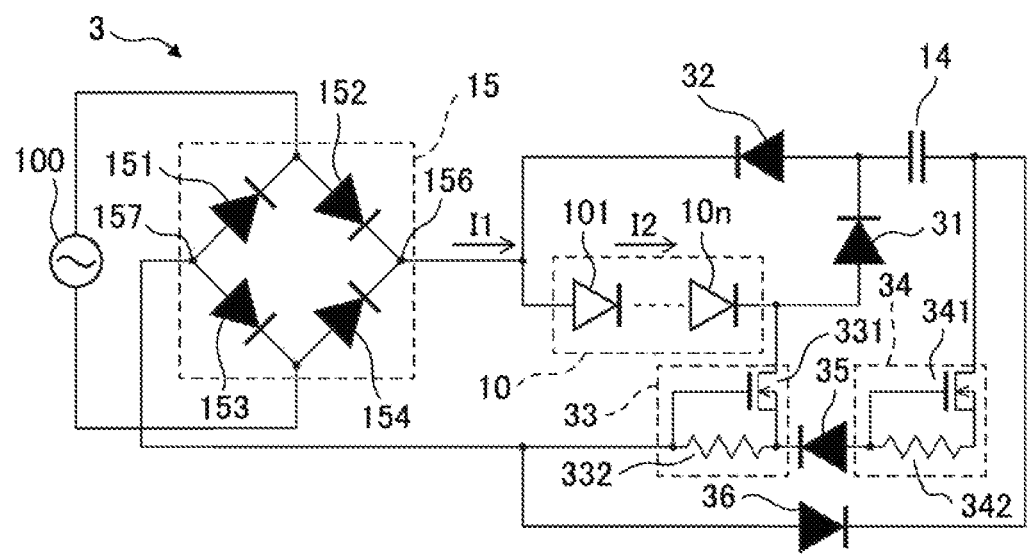
FIG. 5B is a more-detailed circuit diagram of the LED drive circuit illustrated in FIG. 5A.

FIG. 5A is a block diagram of an LED drive circuit according to a second embodiment and FIG. 5B is a more-detailed circuit diagram of the LED drive circuit illustrated in FIG. 5A.

An LED drive circuit 3 differs from the LED drive circuit 1 in that a first switch 31 to a third switch 33 are arranged in place of the first switch 11 to the third switch 13. The LED drive circuit 3 further differs from the LED drive circuit 1 in having a current limiting circuit 34, a charge diode 35, and a discharge diode 36. The components of the LED drive circuit 3 other than the first switch 31 to the third switch 33, the current limiting circuit 34, the charge diode 35, and the discharge diode 36 and the functions thereof are the same as the components of the LED drive circuit 1, to which the same symbols are attached, and the functions thereof.

A pair of input terminals of the rectifying circuit 15 is connected to the commercial alternating-current power source 100 and the first terminal 156 of the rectifying circuit 15 is connected to the anode of the LED 101 in the first stage of the LED string 10. The cathode of the LED 10n in the last stage of the LED string 10 is connected to the current input terminal of the third switch 33 and the current output terminal of the third switch 33 is connected to the second terminal 157 of the rectifying circuit 15 and to the anode of the discharge diode 36. The current output terminal of the current limiting circuit 34 is connected, via the charge diode 35, to a third resistor 332 that functions as a current detection element in the third switch 33. One end of the capacitor 14 is connected to the anode of the second switch 32, which is a diode, and to the cathode of the first switch 31, which is a diode, and the other end of the capacitor 14 is connected to the current input terminal of the current limiting circuit 34 and to the cathode of the discharge diode 36. The cathode of the second switch 32 is connected to the anode of the LED 101 in the first stage of the LED string 10 and the anode of the first switch 31 is connected to the cathode of the LED 10n in the last stage of the LED string 10.

The rectifying circuit 15 has the four rectifying diodes, and the first rectifying diode 151 to the fourth rectifying diode 154 and the commercial alternating-current power source 100 is connected to the input terminal. In the rectifying circuit 15, the cathodes of the second rectifying diode 152 and the fourth rectifying diode 154 are connected to the first terminal 156 that outputs a current. The anodes of the first rectifying diode 151 and the third rectifying diode 153 are connected to the second terminal 157 (ground terminal) to which a current returns. In the following explanation, it is assumed that the voltage at the second terminal 157 is 0 [V].

The third switch 33 has a third depletion FET 331 and the third resistor 332 and limits a current that flows through the LED string 10. In the third switch 33, the drain of the third FET 331 is the current input terminal and the left end of the third resistor 332 is the current output terminal. The anode of the LED 101 in the first stage of the LED string 10 is connected to the first terminal 156 of the rectifying circuit 15 and the cathode of the LED 10n in the last stage of the LED string 10 is connected to the drain of the third FET 331. The source of the third FET 331 is connected to the right end of the third resistor 332 and the gate is connected to the left end of the third resistor 332 and to the second terminal 157 of the rectifying circuit 15.

In the current limiting circuit 34, the drain of a first depletion FET 341 is the current input terminal and the left terminal of a first resistor 342 is the current output terminal. One end of the capacitor 14 is connected to the anode of the second switch 32 and to the cathode of the first switch 31, and the other end of the capacitor 14 is connected to the drain of the first FET 341 and to the cathode of the discharge diode 36. The source of the first FET 341 is connected to the right end of the first resistor 342 and the gate is connected to the left terminal of the first resistor 342 and to the anode of the charge diode 35. The cathode of the second switch 32 is connected to the anode of the LED 101 in the first stage of the LED string 10 and the anode of the first switch 31 is connected to the cathode of the LED LOO in the last stage of the LED string 10. The cathode of the charge diode 35 is connected to the right end of the third resistor 332 and the anode of the discharge diode 36 is connected to the left terminal of the third resistor 332 and to the second terminal 157 of the rectifying circuit 15. The current limiting circuit 34 limits a current that flows through the first switch 31 and to the capacitor 14 and prevents the capacitor 14 from being charged instantaneously.

The operation of the LED drive circuit 3 is explained, by referring to FIG. 2A to FIG. 2D again. In the explanation in FIG. 2A to FIG. 2D, the parts and the like illustrated in FIG. 5A and FIG. 5B are referred to without any clear statement in particular.

FIG. 2A is a diagram illustrating one period of the full-wave rectified voltage V0. One period of the full-wave rectified voltage V0 is a half period of a sinusoidal wave and is obtained by full-wave rectifying the output voltage of the commercial alternating-current power source 100. However, the full-wave rectified voltage V0 is a conceptual voltage represented as a reference or the like with respect to time about the operation of the LED drive circuit 3 and does not appear on any wire of the LED drive circuit 3.

During period of time t1 in which the full-wave rectified voltage V0 reaches the threshold voltage V1 of the LED string 10 from 0 [V], as illustrated in FIG. 2B, the rectified current I1 does not flow into the LED string 10 from the rectifying circuit 15. On the other hand, the capacitor voltage V3 of the capacitor 14 is slightly higher than the threshold voltage V1 of the LED string 10 (FIG. 2D). Thus, by discharging the capacitor 14, the light emission current I2 flows (FIG. 2C), which returns to the capacitor 14 via the second switch 32, the LED string 10, the third switch 33, and the discharge diode 36, and therefore the capacitor voltage V3 of the capacitor 14 becomes low (FIG. 2D).

Terms and the like are explained. The threshold voltage V1 is the product of a forward drop voltage Vd of the LEDs 101 to 101n connected in series within the LED string 10 and a number N of serial stages of the LEDs 101 to 101n (Vd×N). The third switch 33 sets the upper limit value of a source-drain current of the third FET 331 to the first constant current I11 by feeding back the voltage drop of the third resistor 332 for current detection to the third FET 331. The current limiting circuit 34 sets the upper limit value of a source-drain current of the first FET 341 to the second constant current I12 by feeding back the voltage drop of the first resistor 342 for current detection to the first FET 341. When a current whose magnitude is larger than or equal to a predetermined value flows in from the right end of the third resistor 332, the third FET 331 cuts off and the third switch 33 turns off. In the following explanation, the forward drop voltages of the first switch 31 and the second switch 32 are ignored. The voltage drops of the third resistor 332 and the first resistor 342 are also ignored except for the explanation in which the feedback control of the third FET 331 and the first FET 341 is referred to.

During period of time t2 in which the full-wave rectified voltage V0 reaches the charge start voltage V2 from the threshold voltage V1, the rectified current I1 flows (FIG. 2B), which starts from the rectifying circuit 15, flows through the LED string 10 and the third switch 33, and returns to the rectifying circuit 15. During period of time t2, the first constant current I11 that flows as the rectified current I1 is the upper limit current of the third switch 33. Further, during period of time t2, charge/discharge of the capacitor 14 does not take place, and therefore the capacitor voltage V3 is constant (FIG. 2D).

When the full-wave rectified voltage V0 reaches the threshold voltage V1, the voltage at the anode of the LED 101 in the first stage of the LED string 10 is the capacitor voltage V3 and the capacitor voltage V3 has a value somewhat higher than that of the threshold voltage V1 (FIG. 2D). During period of time t2, at the first timing, the capacitor voltage V3 is applied to the anode of the LED 101 in the first stage of the LED string 10. Thus, the timing at which the second switch 32 turns off, in other words, the timing at which the rectified current I1 begins to flow from the rectifying circuit 15 toward the LED string 10 is when the full-wave rectified voltage V0 becomes somewhat higher than the threshold voltage V1. However, in order to simplify explanation, it is assumed that the rectified current I1 begins to flow when the full-wave rectified voltage V0 reaches the threshold voltage V1 (the first timing of period of time t2) (FIG. 2B).

In the actual circuit, when the rectified current I1 flows during period of time t2, the capacitor voltage V3 is somewhat higher than the threshold voltage V1 (FIG. 2D). On the other hand, except for the first timing of period of time t2, the voltage at the anode of the LED 101 in the first stage of the LED string 10 is higher than the capacitor voltage V3. When the voltage at the anode of the LED 101 in the first stage of the LED string 10 becomes higher than the capacitor voltage V3, a reverse bias is applied to the second switch 32, which is a diode, and the second switch 32 turns off. Further, the voltage at the cathode of the LED 10n in the last stage of the LED string 10 is lower than the capacitor voltage V3, and therefore a reverse bias is applied to the first switch 31, which is a diode, and the first switch 31 turns off. Since both the first switch 31 and the second switch 32 turn off, during period of time t2, the capacitor is neither charged nor discharged (FIG. 2D).

During period of time t3 in which the full-wave rectified voltage V0 exceeds the charge start voltage V2, the rectified current I1 flows (FIG. 2B), which starts from the rectifying circuit 15, flows through the LED string 10, the first switch 31, the capacitor 14, the current limiting circuit 34, the charge diode 35, and the third resistor 332, and returns to the rectifying circuit 15. During period of time t3, the second constant current I12 that flows as the rectified current I1 is the upper limit current of the current limiting circuit 34. Further, during period of time t3, the capacitor 14 is charged and the capacitor voltage V3 increases (FIG. 2D). During period of time t3, the current is limited, and therefore the capacitor 14 is not charged instantaneously. Thus, the rectified current I1 continues to flow even after time t6 and the charge of the capacitor 14 continues.

During period of time t3, the second switch 32 and the discharge diode 36 turn off. Further, when a current flows into the third resistor 332 from the current limiting circuit 34 via the charge diode 35, the source-drain current of the third FET 331 is shut off and the third switch 33 turns off. In order to simplify the explanation of period of time t3, it is assumed that the current limitation and the capacitance of the capacitor 14 are set appropriately and that the capacitor voltage V3 increases linearly (FIG. 2D).

During period of time t4 in which the full-wave rectified voltage V0 falls from the charge start voltage V2 to the threshold voltage V1, as in period of time t2, the rectified current I1 flows (FIG. 2B), which starts from the rectifying circuit 15, flows through the LED string 10 and the third switch 33, and returns to the rectifying circuit 15. During period of time t4, the first constant current I11 that flows as the rectified current I1 is the upper limit current of the third switch 33. During period of time t4, no current flows to the capacitor 14, and therefore the capacitor voltage V3 is constant (FIG. 2D).

During period of time t4, the rectified current I1 that is output from the rectifying circuit 15 suspends when the full-wave rectified voltage V0 becomes equal to the capacitor voltage V3, which is a voltage somewhat higher than the threshold voltage V1. However, in order to simplify explanation, it is assumed that the rectified current I1 suspends when the full-wave rectified voltage V0 becomes equal to the threshold voltage V1 (FIG. 2B).

During period of time t5 in which the full-wave rectified voltage V0 falls from the threshold voltage V1 to 0 [V], no current flows into the LED string 10 from the rectifying circuit 15 (FIG. 2B). On the other hand, by discharging the capacitor 14, the light emission current I2 flows (FIG. 2C), which starts from the capacitor 14, flows through the second switch 32, the LED string 10, the third switch 33, and the discharge diode 36, and returns to the capacitor 14. The first constant current I11 that flows as the light emission current I2 is the upper limit current of the third switch 33. Since the capacitor 14 is discharged, the capacitor voltage V3 lowers (FIG. 2D).

In the LED drive circuit 3, the capacitor 14 is charged by the current that flows out from the cathode of the LED 10n in the last stage of the LED string 10. The voltage that is applied to one end of the capacitor 14 is (Vp−V1) [V] at the maximum, since the full-wave rectified voltage V0 undergoes a voltage drop due to the LED string 10, and the capacitor voltage V3 is lower than the peak voltage Vp of the full-wave rectified voltage V0 and if the capacitance of the capacitor 14 is sufficiently large, the capacitor voltage V3 becomes a voltage slightly higher than the threshold voltage V1. The LED drive circuit 3 controls charge/discharge of the capacitor 14 by the first switch 31 to the third switch 33 and the like by using the fact that the full-wave rectified voltage V0 fluctuates periodically and the characteristics that the capacitor voltage V3 is slightly higher than the threshold voltage V1. Further, by appropriately setting the first and second constant currents I11 and I12 and the capacitance value of the capacitor 14, the turned-off period of time of the LEDs included in the LED string 10 may be eliminated.

Further, the LED drive circuit 3 charges the capacitor 14 with the second constant current I12 by the current limiting circuit 34 across the entire period of time t3 in which the full-wave rectified voltage V0 exceeds the charge start voltage V2. The current (the second constant current I12) that charges the capacitor 14 becomes symmetrical with respect to time t6 at which the full-wave rectified voltage V0 reaches the peak voltage Vp. Since the current that charges the capacitor 14 becomes symmetrical with respect to time t6, the rectified current I1 that is output from the rectifying circuit 15 becomes symmetrical with respect to time t6 (FIG. 2B).

Thus, the LED drive circuit 3 eliminates the turned-off period of time and at the same time, causes the peak of the current waveform that is drawn from the commercial alternating-current power source 100 to coincide with the peak of the voltage waveform of the commercial alternating-current power source 100, and further, changes the current waveform into a waveform close to that of a sinusoidal wave, and therefore it the total harmonic distortion may be low. Further, in the LED drive circuit 3, since the LEDs 101 to 10n included in the LED string 10 emit light during all the periods of time, and the light emission current I2 increases during period of time t3 including the peak voltage Vp of the full-wave rectified voltage V0, the LED string 10 may be efficiently used. Since the LED string 10 is efficiently used, even if the LED string 10 includes a comparatively small number of LEDs 101 to 10n, illumination may be bright.

In the LED drive circuit 3, the charge diode 35 and the discharge diode 36 may be omitted. When the charge diode 35 and the discharge diode 36 are omitted, the voltage drop of the third resistor 332 becomes 0 [V] during periods of time t1 and t5 and the light emission current I2 returns to the capacitor 14 without being substantially subjected to the current limitation of the third FET 331, and therefore the amount of discharge of the capacitor 14 increases. Thus, when the charge diode 35 and the discharge diode 36 are omitted, the amount of discharge of the capacitor 14 increases, and therefore it is necessary to increase the capacitance of the capacitor 14 in order to eliminate the turned-off period of time. On the other hand, in order to prevent the capacitance of the capacitor 14 from becoming large, it is preferable to provide the charge diode 35 and the discharge diode 36 to prevent a current from invading the current limiting circuit 34 by the charge diode 35 during periods of time t1 and t5 and at the same time, to form a discharge path on which the current limitation is imposed by the discharge diode 36.

Further, in the LED drive circuit 3, the charge diode 35 and the discharge diode 36 may be omitted, and the discharge path of the capacitor 14 may be formed by inserting a serial circuit including a diode and a resistor between the cathode of the LED 10n in the last stage of the LED string 10 and the other end of the capacitor 14. However, if a diode and a resistor are inserted between the cathode of the LED 10n in the last stage of the LED string 10 and the other end of the capacitor 14, the discharge current of the capacitor 14 changes over time due to the time constant determined by the values of the capacitor 14 and the resistor, a loss occurs at the time of charge, and so on.

In the LED drive circuit 3, a resistor may be arranged in place of the third switch 33 and the current limiting circuit 34. However, in the arrangement, a loss at the time of charge/discharge of the capacitor 14 becomes large. Further, in order to keep the light emission current I2 constant, it is preferable to limit the upper limit value of the current that flows through the third switch 33 and the current limiting circuit 34. In the LED drive circuit 3, a well-known constant current circuit or a constant current element including an enhancement FET, a bipolar transistor, a current detection register, and a pull-up resistor may be arranged, in place of the third switch 33 and the current limiting circuit 34.

The LED drive circuit 3 uses the switching characteristics of the first switch 31 and the second switch 32, which are diodes, the charge diode 35, and the discharge diode 36, but what exhibits the switching characteristics is not limited to a diode. The first switch 31, the second switch 32, the charge diode 35, and the discharge diode 36 may be replaced with well-known analog switches.

In the actual LED drive circuit 3, the width of fluctuations in the capacitor voltage V3 (see FIG. 2D) is about 10 V so that the turned-off period of time is completely eliminated. The LED drive circuit 3 has no turned-off period of time, and therefore the capacitance of the capacitor 14 is comparatively large. For example, if the period of time, which is the sum of period of time t1 and period of time t5, is taken to be 2.5 ms and the light emission current I2 that flows from the capacitor 14 during period of time t1 and period of time t4 is taken to be 100 mA, the capacitance of the capacitor 14 is 22 to 100 μF. If the capacitance of the capacitor 14 is reduced, the phenomenon that has been hitherto ignored becomes remarkably. For example, the fluctuations in the capacitor voltage V3 become large and the charge start voltage V2 fluctuates significantly during period of time t3. Further, if charge is completed on the way during period of time t3, the second constant current I12 is no longer symmetrical with respect to time t6, and therefore the total harmonic distortion will be increased.

It may be sufficient only to shorten the turned-off period of time. When it is sufficient only to shorten the turned-off period of time, the capacitance of the capacitor 14 can be further reduced. During the turned-off period of time, no current flows through the LED string 10 and the capacitor voltage V3 becomes substantially equal to the threshold voltage V1. The above-described problem may occur.

Third Embodiment

In the LED drive circuit in which the LEDs included in the LED string are turned on by simply applying the full-wave rectified voltage to the LED string, when the full-wave rectified voltage is lower than the threshold voltage at which the LED string begins to emit light, none of the LEDs included in the LED string will turn on. If the number of serial stages of the LEDs included in the LED string is increased, the turned-off period of time lengthens. On the other hand, if the number of serial stages of the LEDs included in the LED string is decreased in order to shorten the turned-off period of time, the percentage of power loss due to the current limiting circuit increases. On the other hand, an LED drive circuit is known, which is capable of shortening the turned-off period of time by dividing the LED string into a plurality of partial LED strings and by turning on the LEDs included in the partial LED string when the full-wave rectified voltage is lower than the threshold voltage of the LED string and is higher than or equal to the threshold voltage of the partial LED string.

Figure 6:
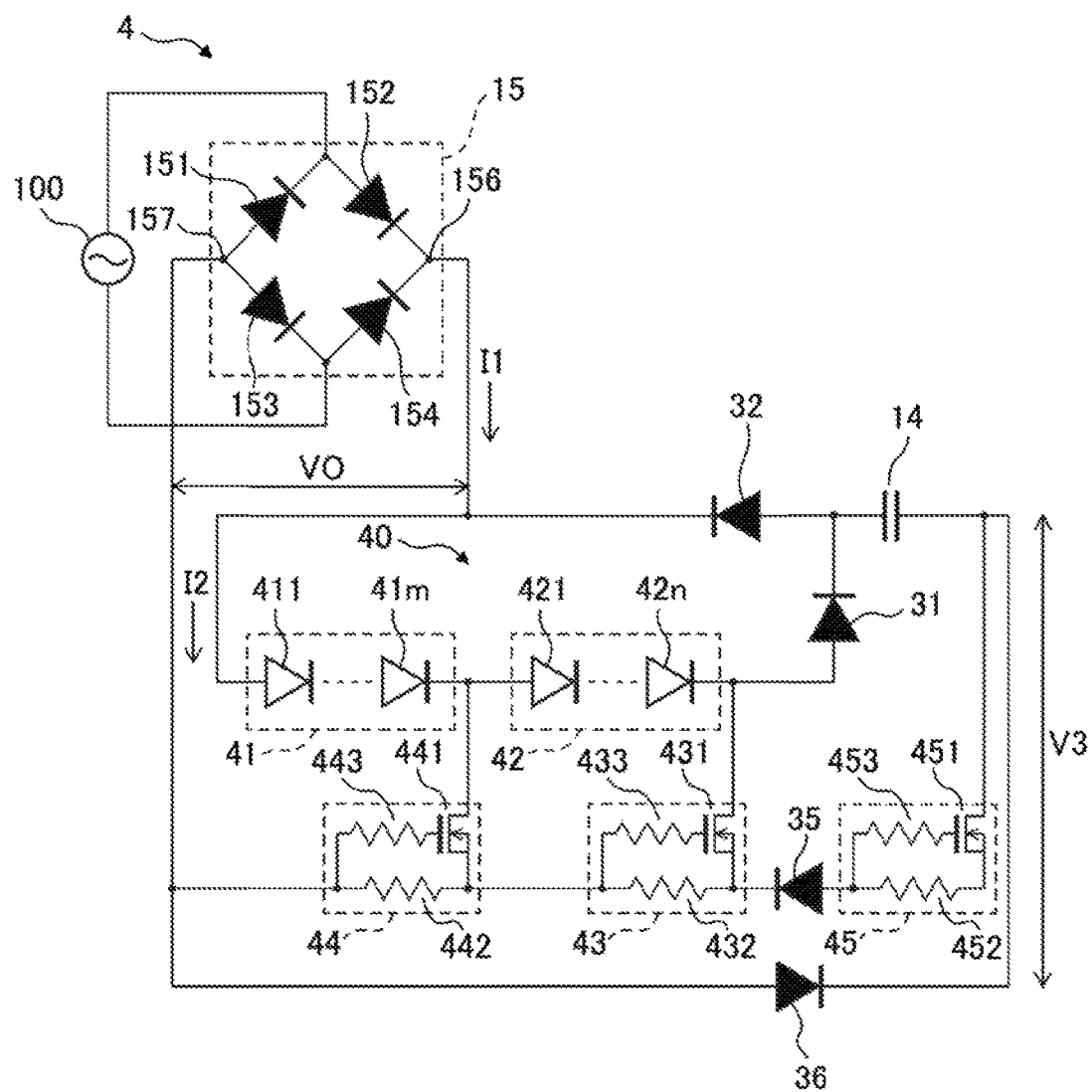
FIG. 6 is a circuit diagram of an LED drive circuit according to a third embodiment.

FIG. 6 is a circuit diagram of an LED drive circuit according to a third embodiment.

An LED drive circuit 4 differs from the LED drive circuit 3 in that an LED string 40 including a first partial LED string 41 and a second partial LED string 42 is arranged in place of the LED string 10. Further, the LED drive circuit 4 differs from the LED drive circuit 3 in that a third switch 43 and a fourth switch 44 are arranged in place of the third switch 33. Furthermore, the LED drive circuit 4 differs from the LED drive circuit 3 in that a current limiting circuit 45 is arranged in place of the current limiting circuit 34. The components of the LED drive circuit 4 other than the first partial LED string 41, the second partial LED string 42, the third switch 43, the fourth switch 44, and the current limiting circuit 45 and the functions thereof are the same as the components of the LED drive circuit 3, to which the same symbols are attached, and the functions thereof. Detailed explanation of the components of the LED drive circuit 4 other than the first partial LED string 41, the second partial LED string 42, the third switch 43, the fourth switch 44, and the current limiting circuit 45 is omitted.

The first partial LED string 41 includes a plurality of LEDs 411 to 41m connected in series and the second partial LED string 42 includes a plurality of LEDs 421 to 42n connected in series. The cathode of the LED 41m in the last stage of the first partial LED string 41 is connected to the anode of the LED 421 in the first stage of the second partial LED string 42 and to the current input terminal of the fourth switch 44. The cathode of the LED 42n in the last stage of the second partial LED string 42 is connected to the anode of the first switch 31 and to the current input terminal of the third switch 43. The anode of the LED 411 in the first stage of the first partial LED string 41 is connected to the first terminal 156 of the rectifying circuit 15 and to the cathode of the second switch 32.

The third switch 43 has a third depletion FET 431, a third resistor 432, and a gate protection resistor 433 and functions as a current limiting circuit that causes a second constant current I42 to flow. In the third switch 43, the drain of the third FET 431 is the current input terminal and the left end of the third resistor 432 is the current output terminal. The fourth switch 44 has a fourth depletion FET 441, a fourth resistor 442, and a gate protection resistor 443 and functions as a bypass circuit that causes a first constant current I41 to flow. In the fourth switch 44, the drain of the fourth FET 441 is the current input terminal and the left end of the fourth resistor 442 is the current output terminal.

The source of the third FET 431 is connected to the cathode of the charge diode 35 and to the right end of the third resistor 432, and the gate of the third FET 431 is connected to the left end of the third resistor 432 via the gate protection resistor 433. The source of the fourth FET 441 is connected to the right end of the fourth resistor 442 and to the left end of the third resistor 432, and the gate of the fourth FET 441 is connected to the left end of the fourth resistor 442 and to the second terminal 157 of the rectifying circuit 15 via the gate protection resistor 443.

The current limiting circuit 45 has a first depletion FET 451, a first resistor 452, and a gate protection resistor 453 and is a current limiting circuit that causes a third constant current I43 to flow. The drain of the first FET 451 is the current input terminal and the left end of the first resistor 452 is the current output terminal.

The drain of the first FET 451, which is the current input terminal of the current limiting circuit 45, is connected to the other end of the capacitor 14 and to the cathode of the discharge diode 36. The left end of the first resistor 452, which is the current output terminal of the current limiting circuit 45, is connected to the anode of the charge diode 35.

Next, with reference to FIG. 7A to FIG. 7D, the operation of the LED drive circuit 4 is explained. In the explanation in FIG. 7A to FIG. 7D, the parts and the like illustrated in FIG. 6 are referred to without any clear statement in particular.

Figure 7A:
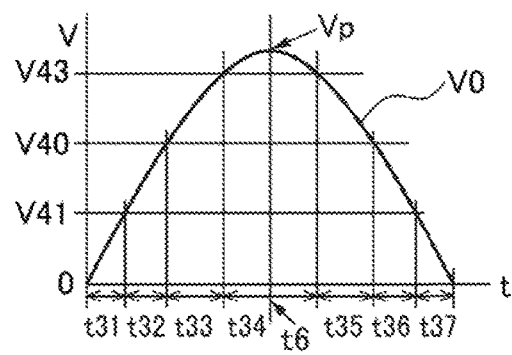
FIG. 7A is a diagram illustrating a change over time across one period of the full-wave rectified voltage.
Figure 7B:
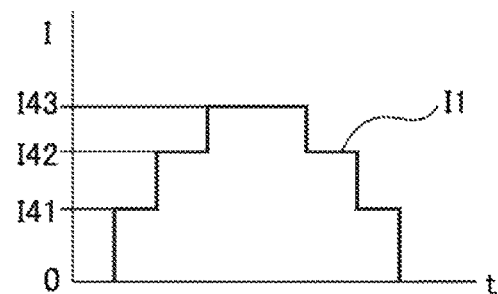
FIG. 7B is a diagram illustrating a change over time in the rectified current.
Figure 7C:
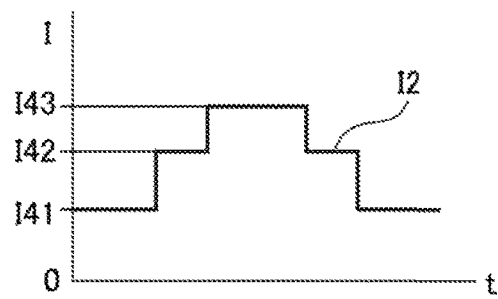
FIG. 7C is a diagram illustrating a change over time in the light emission current.
Figure 7D:
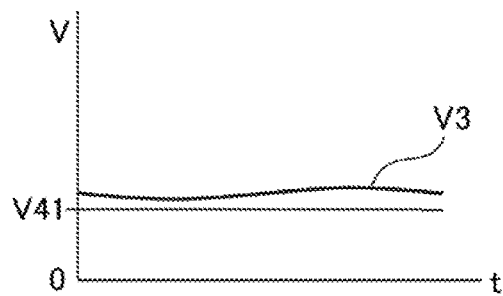
FIG. 7D is a diagram illustrating a change over time in the capacitor voltage.

FIG. 7A is a diagram illustrating a change over time across one period of the full-wave rectified voltage V0 that is output between the first terminal 156 and the second terminal 157 of the rectifying circuit 15. The full-wave rectified voltage V0 is a conceptual voltage represented as a reference or the like with respect to time about the operation of the LED drive circuit 4 and does not appear on any wire of the LED drive circuit 4. FIG. 7B is a diagram illustrating a change over time in the rectified current I1 in accordance with the change in the full-wave rectified voltage V0, FIG. 7C is a diagram illustrating a change over time in the light emission current I2 in accordance with the change in the full-wave rectified voltage V0, and FIG. 7D is a diagram illustrating a change over time in the capacitor voltage V3 in accordance with the change in the full-wave rectified voltage V0. In FIG. 7A to FIG. 7D, the horizontal axis represents the time, in FIG. 7A and FIG. 7D, the vertical axis represents the voltage, and in FIG. 7B and FIG. 7C, the vertical axis represents the current. The time of the horizontal axis in FIG. 7B to FIG. 7D has the same length as that of the time of the horizontal axis in FIG. 7A. The horizontal axis in FIG. 7A includes periods of time t31 to t37 and time t6.

Period of time t31 is a period of time in which the full-wave rectified voltage V0 reaches a threshold voltage V41 of the first partial LED string 41 from 0 [V]. During period of time t31, the rectified current I1 does not flow into the first partial LED string 41 from the rectifying circuit 15 as illustrated in FIG. 7B. On the other hand, the capacitor voltage V3 is slightly higher than the threshold voltage V41 of the first partial LED string 41 (FIG. 7D). During period of time t31, by discharging the capacitor 14, the light emission current I2 flows (see FIG. 7C), which returns to the capacitor 14 via the second switch 32, the first partial LED string 41, the fourth switch 44, and the discharge diode 36. Accompanying the discharge of the capacitor 14, the capacitor voltage V3 lowers (FIG. 7C).

Terms and the like are explained. The threshold voltage V41 of the first partial LED string 41 is the product of the forward drop voltage Vd of the LEDs 411 to 41m included in the first partial LED string 41 and a number M of serial stages of the LEDs 411 to 41m (Vd×M). Similarly, a threshold voltage V42 (V40−V41) of the second partial LED string 42 is the product of the forward drop voltage Vd of the LEDs 421 to 42n included in the second partial LED string 42 and the number N of serial stages of the LEDs 421 to 42n (Vd×n). Further, a threshold voltage V40 of the LED string 40 is the product of the forward drop voltage Vd of the LEDs 411 to 41m and 421 to 42n included in the LED string 40 and a number (N+M) of serial stages of the LED 411 to 41m and 421 to 42n (Vd×(N+M)). The third switch 43 sets the upper limit value of the source-drain current of the third FET 431 to the second constant current I42 by feeding back the voltage drop of the third resistor 432 to the third FET 431. The fourth switch 44 sets the upper limit value of the source-drain current of the fourth FET 441 to the first constant current I41 by feeding back the voltage drop of the fourth resistor 442 to the fourth FET 441. The current limiting circuit 45 sets the upper limit value of the source-drain current of the first FET 451 to the third constant current I43 by feeding back the voltage drop of the first resistor 452 to the first FET 451. Further, when a current whose magnitude is larger than or equal to a predetermined value flows in from the right end of the third resistor 432, the third FET 431 cuts off, and therefore the third switch 43 turns off. When a current whose magnitude is larger than or equal to a predetermined value flows in from the right end of the fourth resistor 442, the fourth FET 441 cuts off, and therefore the fourth switch 44 turns off. In the following explanation, the forward drop voltages of the first switch 31 and the second switch 32, which are diodes, the charge diode 35, and the discharge diode 35 are ignored. The voltage drops of the third resistor 432, the fourth resistor 442, and the first register 452 are ignored except for the explanation in which the feedback control of the third FET 431, the fourth FET 441, and the first FET 451 is referred to. A charge start voltage V43 is the sum of the capacitor voltage V3 and the threshold voltage V40 of the LED string and fluctuates due to charge/discharge. However, the width of fluctuations in the capacitor V3 and the deviation from the threshold voltage V41 are small compared to the full-wave rectified voltage V0. Thus, in order to simplify explanation, in FIG. 7A, the charge start voltage V43 is represented as the sum of the threshold voltage V40 and the threshold voltage V41.

Period of time t32 is a period of time in which the full-wave rectified voltage V0 reaches the threshold voltage V40 (sum of the threshold voltage V41 of the first partial LED string 41 and the threshold voltage V42 of the second partial LED string 42) of the LED string 40 from the threshold voltage V41 of the first partial LED string 41. During period of time t32, the rectified current I1 flows (FIG. 7B), which starts from the rectifying circuit 15, flows through the first partial LED string 41 and the fourth switch 44, and returns to the rectifying circuit 15. During period of time t32, the first constant current I41 that flows as the rectified current I1 is the upper limit current of the fourth switch 44. Further, during period of time t32, the capacitor 14 is neither charged nor discharged, and therefore the capacitor voltage V3 is constant (FIG. 7D).

When the full-wave rectified voltage V0 reaches the threshold voltage V41 of the first partial LED string 41 (the lead part of period of time t32), the capacitor voltage V3, which is the voltage at the anode of the LED 411 in the first stage of the first partial LED string 41, is somewhat higher than the threshold voltage V41 of the first partial LED string 41 (FIG. 7D). So, the capacitor voltage V3 is applied to the anode of the LED 421 in the first stage of the first partial LED string 41, and therefore the timing at which the rectified current I1 begins to flow to the first partial LED string 41 from the rectifying circuit 15 is when the full-wave rectified voltage V0 becomes somewhat higher than the threshold voltage V41. However, in order to simplify explanation, it is assumed that the rectified current I1 begins to flow when the full-wave rectified voltage V0 reaches the threshold voltage V41 of the first partial LED string 41 (FIG. 7B).

During period of time t32, when the rectified current I1 flows, the capacitor voltage V3 is somewhat higher than the threshold voltage V41 of the first partial LED string 41 (FIG. 7D). On the other hand, the voltage at the anode of the first partial LED string 41 is higher than the capacitor voltage V3 except for the first timing during period of time t32. When the voltage at the anode of the LED 411 in the first stage of the first partial LED string 41 becomes higher than the capacitor voltage V3, a reverse bias is applied to the second switch 32, which is a diode, and therefore the second switch 32 turns off. Further, the voltage at the cathode of the LED 42n in the last stage of the second partial LED string 42 is lower than the capacitor voltage V3, and therefore a reverse bias is applied to the first switch 31 and the first switch 31 turns off. Since both the first switch 31 and the second switch 32 turn off, during period of time t32, the capacitor 14 is neither charged nor discharged, and therefore the capacitor voltage V3 is constant (FIG. 7D).

Period of time t33 is a period of time in which the full-wave rectified voltage V0 reaches the charge start voltage V43 from the threshold voltage V40 of the LED string 40. During period of time t33, the rectified current I1 flows (FIG. 7B), which starts from the rectifying circuit 15, flows through the first partial LED string 41, the second partial LED string 42, the third switch 43, and the fourth resistor 442, and returns to the rectifying circuit 15. At this time, since the voltage drop of the fourth resistor 442 becomes large, and in the fourth FET 441 included in the fourth switch 44, the source-drain current is shut off, and therefore the fourth FET 441 turns off. During period of time t33, the second constant current I42 that flows as the rectified current I1 is the upper limit current of the third switch 43. Further, during period of time t33, as during period of time t32, the capacitor 34 is neither charged nor discharged, and therefore the capacitor voltage V3 is constant (FIG. 7D).

Period of time t34 is a period of time in which the full-wave rectified voltage V0 exceeds the charge start voltage V43. During period of time t34, the rectified current I1 flows (FIG. 7B), which starts from the rectifying circuit 15, flows through the LED string 40, the first switch 31, the capacitor 14, the current limiting circuit 45, the charge diode 35, the third resistor 432, and the fourth resistor 442, and returns to the rectifying circuit 15. During period of time t34, the third constant current I43 that flows as the rectified current I1 is the upper limit current of the current limiting circuit 45. Further, during period of time t34, the current limitation is imposed on the rectified current I1, and therefore even after time t6, the charge of the capacitor 14 continues and the capacitor voltage V3 increases (FIG. 7D).

During period of time t34, the second switch 32 and the discharge diode 36 turn off. When a current flows into the third resistor 432 from the current limiting circuit 45 via the charge diode 35, the third FET 431 turns off. Further, during period of time t34, even after the full-wave rectified voltage V0 reaches the peak voltage Vp, the capacitor voltage V3 increases linearly by appropriately setting the capacitance of the capacitor 14 and the third constant current I43 (FIG. 7D).

Period of time t35 is a period of time in which the full-wave rectified voltage V0 falls from the charge start voltage V43 to the threshold voltage V40 of the LED string 40. During period of time t35, as during period of time t33, the rectified current I1 flows (FIG. 7B), which starts from the rectifying circuit 15, flows through the LED string 40, the third switch 43, and the fourth resistor 442, and returns to the rectifying circuit 15. During period of time t35, the second constant current I42 that flows as the rectified current I1 is the upper limit current of the third switch 43. During period of time t35, no current flows to the capacitor 14, and therefore the capacitor voltage V3 is constant (FIG. 7D).

Period of time t36 is a period of time in which the full-wave rectified voltage V0 falls from the threshold voltage V40 of the LED string 40 to the threshold voltage V41 of the first partial LED string 41. During period of time t36, as during period of time t32, the rectified current I1 flows (FIG. 7B), which starts from the rectifying circuit 15, flows through the first partial LED string 41 and the fourth switch 44, and returns to the rectifying circuit 15. A value I21 of the current I1 during period of time t36 is the upper limit current of the fourth switch 44. Further, during period of time t36, no current flows to the capacitor 14, and therefore the capacitor voltage V3 is constant (FIG. 7D).

During period of time 136, the rectified current I1 that is output from the rectifying circuit 15 suspends when the full-wave rectified voltage V0 becomes equal to the capacitor voltage V3, which is a voltage somewhat higher than the threshold voltage V41 of the first partial LED string 41. However, in order to simplify explanation, it is assumed that the rectified current I1 suspends when the full-wave rectified voltage V0 becomes equal to the threshold voltage V41 of the first partial LED string 41 (FIG. 7B).

Period of time t37 is a period of time in which the full-wave rectified voltage V0 falls from the threshold voltage V41 of the first partial LED string 41 to 0 [V]. During period of time t37, no current flows into the first partial LED string 41 from the rectifying circuit 15 (FIG. 7B). On the other hand, by discharging the capacitor 14, the light emission current I2 flows (FIG. 7D), which returns to the capacitor 14 via the second switch 32, the first partial LED string 41, the fourth switch 44, and the discharge diode 36. The first constant current I41 that flows as the light emission current I2 is the upper limit current of the fourth switch 44. Since the capacitor 14 discharges, the capacitor voltage V3 lowers (FIG. 7D).

In the LED drive circuit 4, the threshold voltage V41 of the first partial LED string 41 is lower than the threshold voltage V1 of the LED string 10 included in the LED drive circuit 3. Further, in the LED drive circuit 4, period of time (t31+t37) in which the capacitor 14 discharges is shorter than period of time (t1+t5) illustrated in FIG. 2A. Thus, in the LED drive circuit 4, the size and capacitance of the capacitor 14 may be reduced compared to these in the LED drive circuit 3.

In the LED drive circuit 4, the capacitor 14 is charged by a current that flows out from the cathode of the LED 42n in the last stage of the second partial LED string 42. The capacitor voltage V3 is (Vp−V40) at the maximum, since the full-wave rectified voltage V0 undergoes a voltage drop due to the LED string 40, and is slightly higher than the threshold voltage V41 of the first partial LED string 41. The LED drive circuit 4 controls charge/discharge of the capacitor 14 by the first switch 31, the second switch 32, the third switch 43, the fourth switch 44, and so on by using the fact that the full-wave rectified voltage V0 fluctuates periodically and the characteristics that the capacitor voltage V3 is slightly higher than the threshold voltage V41. Further, in the LED drive circuit 4, the turned-off period of time of the LED string 40 may be eliminated by appropriately setting the first and third constant currents I41 and I43 as well as increasing the capacitance of the capacitor 14 to a sufficiently large capacitance.

The LED drive circuit 4 charges the capacitor 14 with the third constant current I43 by the current limiting circuit 45 across the entire period of time t34 in which the full-wave rectified voltage V0 exceeds the charge start voltage V43. Thus, the charge current that charges the capacitor 14 becomes symmetrical with respect to the time axis (time t6) that passes through the peak voltage Vp of the full-wave rectified voltage V0. Since the charge current that charges the capacitor 14 becomes symmetrical with respect to time t6, the rectified current I1 that is output from the rectifying circuit 15 becomes symmetrical with respect to the time axis (time t6) (FIG. 7B).

Thus, the LED drive circuit 4 eliminates the turned-off period of time and at the same time, causes the peak of the current waveform that is drawn from the commercial alternating-current power source 100 to coincide with the peak of the voltage waveform of the commercial alternating-current power source 100, and changes the current waveform into a waveform close to that of a sinusoidal wave, and therefore the total harmonic distortion may be low.

In the LED drive circuit 4, as in the LED drive circuit 3, the charge diode 35 and the discharge diode 36 may be omitted. In the LED drive circuit 4, the charge diode 35 and the discharge diode 36 may be omitted, and to form the discharge path of the capacitor 14 by inserting a diode and a resistor between the cathode of the LED 42n in the last stage of the second partial LED string 42 and the other end of the capacitor 14. Similarly, the third switch 43, the fourth switch 44, and the current limiting circuit 45 may be resistors, and a well-known constant current circuit or constant current element may be alternatively used in place thereof. Similarly, the first switch 31, the second switch 32, the charge diode 35, and the discharge diode 36 may be replaced with well-known analog switches.

In the LED drive circuit 4, as in the LED drive circuit 3, the width of fluctuations in the capacitor voltage V3 (see FIG. 7D) is small so that the turned-off period of time is completely eliminated. The LED drive circuit 3 has no turned-off period of time, and therefore the capacitance of the capacitor 14 is comparatively large. If the capacitance of the capacitor 14 is reduced, the fluctuations in the capacitor voltage V3 become large and the phenomenon that is ignored as a matter of convenience for explanation becomes remarkable. For example, the fluctuations in the capacitor voltage V3 become large and the charge start voltage V2 fluctuates significantly during period of time t34. Further, if charge is completed on the way during period of time t34, the third constant current I43 is no longer symmetrical with respect to time t6, and therefore the total harmonic distortion will be increased.

Further, when it is sufficient only to shorten the turned-off period of time, the capacitance of the capacitor 14 can be further reduced. During the turned-off period of time, no current flows through the second partial LED string 42 and the capacitor voltage V3 becomes substantially equal to the threshold voltage 41 of the first partial LED string 41. The above-described problem may occur.

Fourth Embodiment

Figure 8:
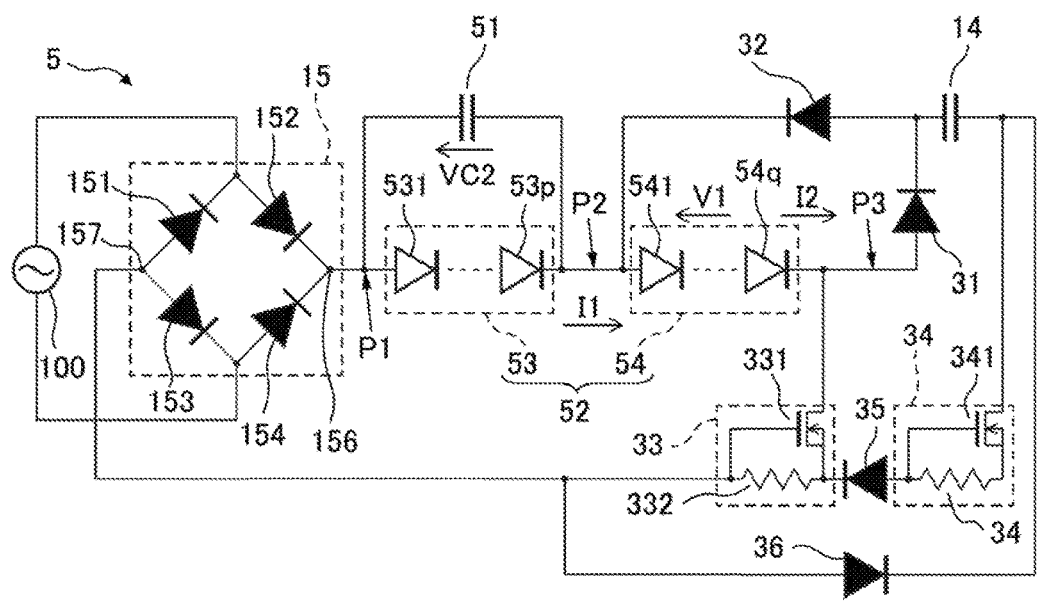
FIG. 8 is a circuit diagram of an LED drive circuit according to a fourth embodiment.

FIG. 8 is a circuit diagram of an LED drive circuit according to a fourth embodiment.

An LED drive circuit 5 differs from the LED drive circuit 3 in that an LED string 52, in which a third partial LED string 53 and a fourth partial LED string 54 are connected in series, and a second capacitor 51 that is connected in parallel to the third partial LED string 53 are arranged. The components of the LED drive circuit 5 other than the LED string 52 and the second capacitor 51 and the functions thereof are the same as the components of the LED drive circuit 3, to which the same symbols are attached, and the functions thereof. Detailed explanation of the components of the LED drive circuit 5 other than the LED string 52 and the second capacitor 51 is omitted.

The third partial LED string 53 includes a plurality of LEDs 531 to 53p connected in series. The fourth partial LED string 54 includes a plurality of LEDs 541 to 54q connected in series. The anode of the LED 531 in the first stage of the third partial LED string 53 is connected to the first terminal 156 of the rectifying circuit 15 and the cathode of the LED 53p in the last stage of the third partial LED string 53 is connected to the anode of the LED 541 in the first stage of the fourth partial LED string 54 and to the cathode of the second switch 32.

The second capacitor 51 is connected in parallel to the third partial LED string 53 and a second capacitor voltage VC2, which is the terminal-to-terminal voltage of the second capacitor 51, is a voltage higher than or equal to a threshold voltage V53 at which the LEDs 531 to 53p included in the third partial LED string 53 begin to emit light. The second capacitor 51 supplies a light emission current to the third partial LED string 53 when the full-wave rectified voltage V0 that is output from the rectifying circuit 15 is lower than a threshold voltage V52 of the LED string 52, and thereby, the LEDs 531 to 53p included in the third partial LED string 53 are caused to emit light. The maximum value of the second capacitor voltage VC2 is the end-to-end voltage of the third partial LED string when a maximum current flows through the third partial LED string 53 in the vicinity of the peak of the full-wave rectified voltage V0 and is a value larger than the threshold voltage V53 by several V. The capacitance of the second capacitor 51 is set to a capacitance so large that the light emission current of the third partial LED string 53 can be supplied sufficiently.

A voltage VP1 at a first point P1 is the voltage at the first terminal 156 of the rectifying circuit 15 and at the anode of the LED 531 in the first stage of the third partial LED string 53. A voltage VP2 at a second point P2 is the voltage at the cathode of the LED 53p in the last stage of the third partial LED string 53 and at the anode of the LED 541 in the first stage of the fourth partial LED string 54, and is lower than the voltage VP1 at the first point 1 by the second capacitor voltage VC2. A voltage VP3 at a third point P3 is the voltage at the cathode of the LED 54q in the last stage of the LED string 52 and at the anode of the first switch 31 and is lower than the voltage VP2 at the point P2 by about a threshold voltage 54 of the fourth partial LED string 54. The threshold voltage 54 is the voltage at which the LEDs 541 to 54q begin to emit light when a voltage is applied across both ends of the fourth partial LED string 54.

Figure 9:
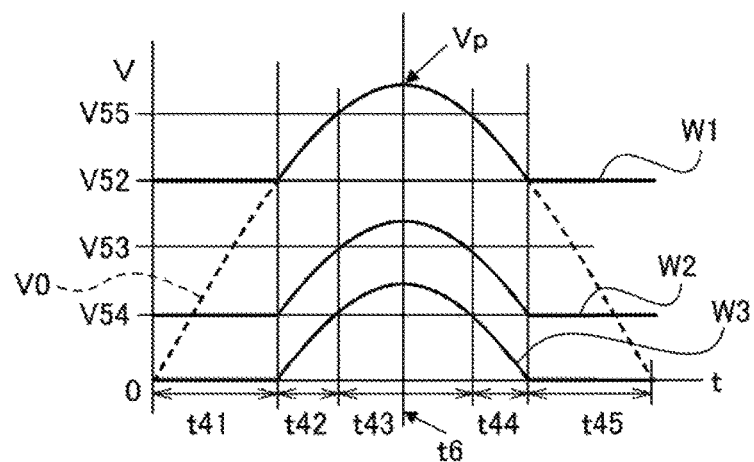
FIG. 9 is a diagram illustrating a relationship between a change over time across one period of the full-wave rectified voltage V0 that is output from the rectifying circuit, and the voltages VP1 to VP3 at the first point P1 to the third point P3
Figure 10A:
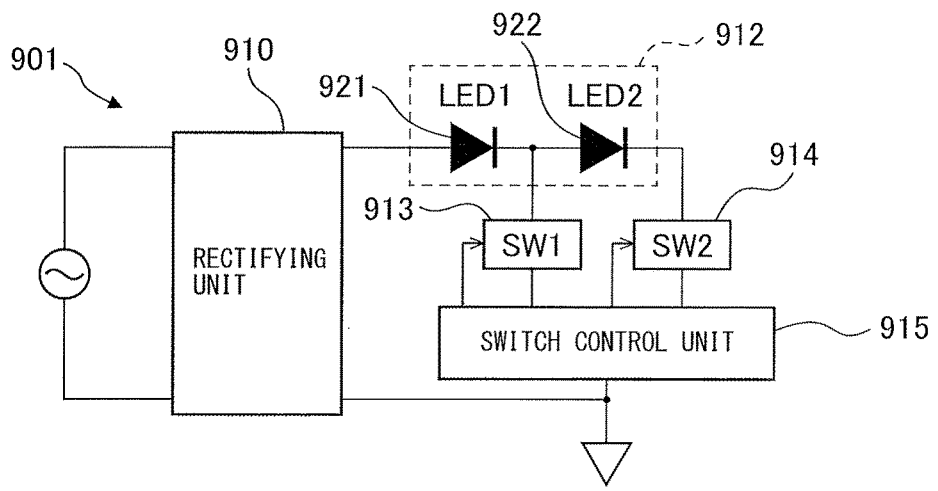
FIG. 10A is a circuit diagram of an example of a conventional LED drive circuit.
Figure 10B:
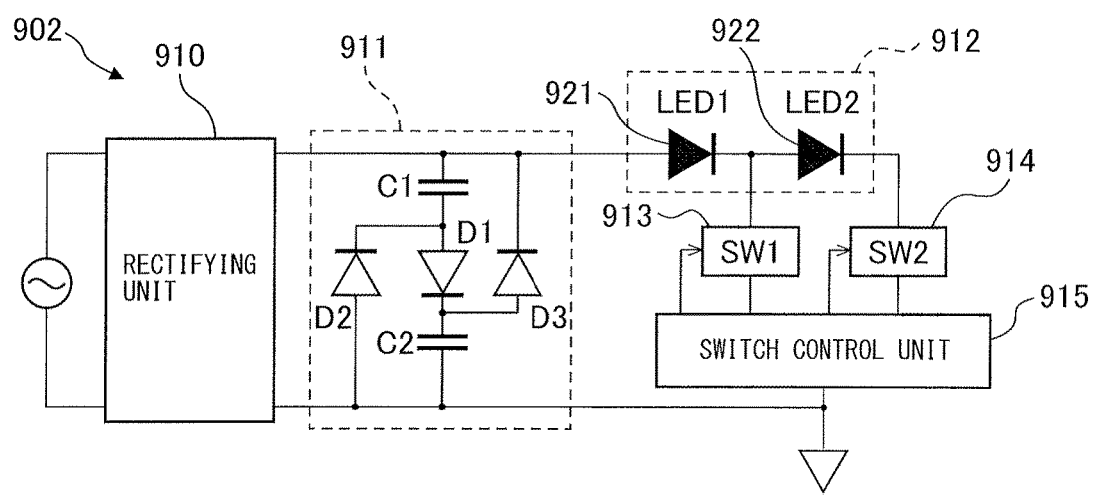
FIG. 10B is a circuit diagram of another example of a conventional LED drive circuit.

FIG. 9 is a diagram illustrating a relationship between a change over time across one period of the full-wave rectified voltage V0 that is output from the rectifying circuit 15, and the voltages VP1 to VP3 at the first point P1 to the third point P3. In FIG. 9, the horizontal axis represents the time and the vertical axis represents the voltage. In FIG. 9, a broken line indicates the waveform of the full-wave rectified voltage V0, a waveform W1 indicates a change over time in the voltage VP1 at the first point P1, a waveform W2 indicates a change over time in the voltage VP2 at the second point P2, and a waveform W3 indicates a change over time in the voltage VP3 at the third point P3. A first capacitor voltage VC1 and the second capacitor voltage VC2 fluctuate accompanying charge/discharge, but the fluctuations are small compared to the full-wave rectified voltage V0 and their values are close to the threshold voltage V54 and the threshold voltage V53, respectively. Thus, as a matter of convenience for explanation, in FIG. 9, it is assumed that the first capacitor voltage VC1 and the second capacitor voltage VC2 are the threshold voltage V54 and the threshold voltage V53, respectively.

Period of time t41 is a period of time in which the full-wave rectified voltage V0 increases from 0 [V] to the threshold voltage 52 of the LED string 52. During period of time t41, the first switch 31 turns off and the second switch 32 and the third switch 33 turn on, and the light emission current I2 is supplied to the fourth partial LED string 54 from the capacitor 14 and the LEDs 541 to 54q included in the fourth partial LED string 54 emit light. At the same time, a light emission current is supplied to the third partial LED string 53 from the second capacitor 51 and the LEDs 531 to 53p Included in the third partial LED string 53 emit light.

Period of time t42 is a period of time in which the full-wave rectified voltage V0 increases from the threshold voltage 53 of the LED string 52 to a charge start voltage V55. The charge start voltage V55 is the sum of the threshold voltage 52 of the LED string 52 and the first capacitor voltage VC1 and changes accompanying charge/discharge. However, the amount of change in the charge start voltage V55 is small compared to the full-wave rectified voltage V0 and is substantially the sum of the threshold voltage 52 and the threshold voltage 54, and therefore in FIG. 9, it is assumed that the charge start voltage V55 is a voltage having a constant value (V52+V54). During period of time t42, the first switch 31 and the second switch 32 turn off and the third switch 33 turns on. At this time, to the LED string 52, the rectified current I1 is supplied from the rectifying circuit 15 and the LEDs 531 to 53p and 541 to 54q emit light. The capacitor 14 is neither charged nor discharged, since the first switch 31 and the second switch 32 turn off. The second capacitor 51 is charged by part of the rectified current I1.

Period of time t43 is a period of time in which the full-wave rectified voltage V0 exceeds the charge start voltage V55. During period of time t43, the first switch 31 turns on and the second switch 32 and the third switch 33 turn off. At this time, to the LED string 52, the rectified current I1 is supplied from the rectifying circuit 15 and the LEDs 531 to 53$p$ and 541 to 54$q$ emit light. The capacitor 14 is charged by the rectified current I1, since the first switch 31 turns on. The second capacitor 51 is charged by part of the rectified current I1.

Period of time t44 is a period of time in which the full-wave rectified voltage V0 falls from the charge start voltage V55 to the threshold voltage V52. Period of time t45 is a period of time in which the full-wave rectified voltage V0 falls from the threshold voltage V52 to 0 [V]. During period of time t44, the LED drive circuit 5 operates as during period of time t42 (but the capacitor 51 slightly discharges) and during period of time t45, the LED drive circuit 5 operates as during period of time t41.

In the LED drive circuit 3, the period of time in which the capacitor 14 can be charged is limited to the period of time in which a voltage about twice the threshold voltage V1 is exceeded. The upper limit of the number of serial stages of the LED string 10 is determined by the peak voltage Vp of the full-wave rectified voltage V0 and the relationship of the limitation. In the LED drive circuit 5, the number of serial stages of the LED string 52 may be increased than the number of serial stages of the LED string 10 in the LED drive circuit 3 by dividing the LED string 52 into the third partial LED string 53 and the fourth partial LED string 54. Thus, the LED drive circuit 5 may emit light more brightly and more efficiently than the LED drive circuit 3.

An example of a difference in the number of serial stages is explained. When the effective value of the alternating-current voltage that is input to the rectifying circuit 15 from the commercial alternating-current power source 100 is 100 [V], the maximum voltage V0 of the full-wave rectified voltage is 141 [V]. Further, in an example, the forward drop voltage Vd of the LEDs 101 to 10$n$, and the LEDs 531 to 53$p$ and 541 to 54$q$ is 3 [V]. In the LED drive circuit 3, when the number of serial stages of the LED string 10 is twenty-three, the charge start voltage V2 will be 136 [V] (=23×3 [V]×2). The capacitor 14 is charged between the charge start voltage V2, which is 136 [V], and the maximum value Vp (141 [V]) of the full-wave rectified voltage V0. On the ether hand, in the LED drive circuit 5, when the number of serial stages of the fourth partial LED string 54 is ten and the number of serial stages of the third partial LED string 53 is twenty-five, the charge start voltage V55 (V54×2+V53) will be 135 [V] (=10×3 [V]×2+25×3 [V]. The capacitor 14 is charged between the charge start voltage V55 (V54×2+V53), which is 135 [V], and the maximum, value Vp (141 [V]) of the full-wave rectified voltage V0.

Thus, when the effective value of the alternating-current voltage that is input to the rectifying circuit 15 is 100 [V], while the number of serial stages of the LED string 10 is twenty-three in the LED drive circuit 3, the number of serial stages of the LED string 52 may be increased to thirty-five in the LED drive circuit 5.

The LED drive circuit according to the present invention may have an aspect as illustrated below.

For example, the LED drive circuit of the present invention may have an aspect of an LED drive circuit that turns on an LED string by charges accumulated in advance in a capacitor when a full-wave rectified voltage is in a phase in which the full-wave rectified voltage is lower than a threshold voltage of the LED string, wherein the LED drive circuit has a rectifying circuit, a light emission circuit, and an auxiliary circuit, the light emission circuit includes an LED string in which a plurality of LEDs is connected in series and a first current limiting circuit, and an anode of the LED string is connected with an output terminal of the rectifying circuit, a cathode of the LED string is connected with a current input terminal of the first current limiting circuit, and a current output terminal of the first current limiting circuit outputs a current toward the rectifying circuit or the capacitor, and the auxiliary circuit includes the capacitor, a first diode, a second diode, and a second current limiting circuit, and one end of the capacitor is connected with an anode of the first diode and a cathode of the second diode, the other end of the capacitor is connected with a current input terminal of the second current limiting circuit, a cathode of the first diode is connected with the anode of the LED string, an anode of the second diode is connected with the cathode of the LED string, and a current output terminal of the second current limiting circuit is connected with a current detection element included in the first current limiting circuit.

In the phase in which the full-wave rectified voltage increases from 0 [V] to a first voltage, no current flows into the LED string from the rectifying circuit. On the other hand, by discharging the capacitor, a current flows, which returns to the capacitor via the first diode and the LED string.

In the phase in which the full-wave rectified voltage increases from the first voltage to a second voltage, a current flows, which starts from the rectifying circuit, flows through the LED string and the first current limiting circuit, and returns to the rectifying circuit. On the other hand, no current flows to the capacitor.

In the phase in which the full-wave rectified voltage exceeds the second voltage, a current flows, which starts from the rectifying circuit, flows through the LED string, the second diode, the capacitor, and the second current limiting circuit, and returns to the rectifying circuit. At this time, the capacitor is charged.

In the phase in which the full-wave rectified voltage falls from the second voltage to the first voltage, a current flows, which starts from the rectifying circuit, flows through the LED string and the first current limiting circuit, and returns to the rectifying circuit. On the other hand, no current flows to the capacitor.

In the phase in which the full-wave rectified voltage falls from the first voltage to 0 [V], no current flows into the LED string from the rectifying circuit. On the other hand, by discharging the capacitor, a current flows, which returns to the capacitor via the first diode and the LED string.

A third diode may be inserted between the current output terminal of the second current limiting circuit and the current detection element included in the first current limiting circuit, and a fourth diode whose cathode may be connected with the other end of the capacitor to form a discharge path of the capacitor.

The first current limiting circuit may be cut off by an output current of the second current limiting circuit.

In the light emission circuit, the LED string may be divided into a plurality of LED strings and a bypass circuit may be provided at the connection point between the divided LED strings.

REFERENCE SIGNS LIST

1 to 5 LED drive circuit
10, 40, 52 LED drive circuit 11, 21, 31 first switch
12, 22, 32 second switch
13, 23, 33, 43 third switch
14 capacitor
15 capacitor
27 control circuit
34,45 current limiting circuit
35 charge diode
36 discharge diode
41 first partial LED string
42 second partial LED string
44 fourth switch
51 second capacitor
53 third partial LED string
54 fourth partial LED string

What is claimed is:

1. An LED drive circuit having:
a rectifying circuit that rectifies an alternating-current voltage and outputs a full-wave rectified voltage;
an LED string including a plurality of LEDs connected in series, in which an anode of an LED in a first stage of the LEDs is connected with a first terminal of the rectifying circuit;
a first switch whose one end is connected to a cathode of an LED in a last stage of the LED string;
a capacitor whose one end is connected to the other end of the first switch;
a second switch that is connected between the one end of the capacitor and the anode of the LED in the first stage of the LED string, and which turns on when the full-wave rectified voltage is lower than a threshold voltage of the LED string and turns off when the full-wave rectified voltage is higher than or equal the threshold voltage;
a third switch that is connected between the cathode of the LED in the last stage of the LED string and a second terminal of the rectifying circuit, and which turns on when the full-wave rectified voltage is lower than a charge start voltage and turns off when the full-wave rectified voltage is higher than or equal to the charge start voltage; and
a current limiting circuit whose current input terminal is connected to an other end of the capacitor and whose current output terminal is connected to the second terminal of the rectifying circuit,
wherein
the current limiting circuit has a first FET whose drain is connected to the other end of the capacitor and a first resistor whose one end is connected to a source of the first FET, and
the third switch includes a third FET whose drain is connected to the cathode of the LED in the last stage of the LED string and a third resistor whose one end is connected to a source of the third FET, and an other end of the first resistor is connected to one end of the third resistor and an other end of the third resistor is connected to the second terminal of the rectifying circuit.

2. The LED drive circuit according to claim 1, wherein
the first switch includes a diode whose anode is connected to the cathode of the LED in the last stage of the LED string and whose cathode is connected to the one end of the capacitor, and
the second switch includes a diode whose anode is connected to the one end of the capacitor and whose cathode is connected to the anode of the LED in the first stage of the LED string.

3. The LED drive circuit according to claim 1, further having:
a charge diode that is inserted between the other end of the first resistor and the one end of the third resistor, and whose anode is connected to the other end of the first resistor and whose cathode is connected to the one end of the third resistor; and
a discharge diode whose anode is connected to the other end of the third resistor and whose cathode is connected to the other end of the capacitor.

4. The LED drive circuit according to claim 1, wherein
the LED string includes a first partial LED string and a second partial LED string whose anode of an LED in a first stage is connected to a cathode of an LED in a last stage of the first partial LED string, and
the LED drive circuit further has a fourth switch whose one end is connected to the cathode of the LED in the last stage of the first partial LED string and to the anode of the LED in the first stage of the second partial LED string and whose an other end is connected to the second terminal of the rectifying circuit.

5. The LED drive circuit according to claim 1, wherein
the LED string includes:
a third partial LED string whose anode of an LED in a first stage is connected with the first terminal of the rectifying circuit; and
a fourth partial LED string whose anode of an LED in a first stage is connected with both the second switch and a cathode of an LED in a last stage of the third partial LED string, and
the LED drive circuit further has a second capacitor connected in parallel to the third partial LED string.

* * * * *